US011950429B2

(12) United States Patent
Jeon

(10) Patent No.: US 11,950,429 B2
(45) Date of Patent: Apr. 2, 2024

(54) FERROELECTRIC CAPACITORS, TRANSISTORS, MEMORY DEVICES, AND METHODS OF MANUFACTURING FERROELECTRIC DEVICES

(71) Applicants: Samsung Electronics Co., Ltd., Suwon-si (KR); KOREA ADVANCED INSTITUTE OF SCIENCE AND TECHNOLOGY, Daejeon (KR)

(72) Inventor: Sanghun Jeon, Seoul (KR)

(73) Assignees: Samsung Electronics Co., Ltd., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 17/078,672

(22) Filed: Oct. 23, 2020

(65) Prior Publication Data
US 2021/0202508 A1    Jul. 1, 2021

(30) Foreign Application Priority Data

Dec. 30, 2019 (KR) .......................... 10-2019-0178508

(51) Int. Cl.
*H10B 53/00* (2023.01)
*G11C 11/22* (2006.01)
(Continued)

(52) U.S. Cl.
CPC ............ *H10B 53/00* (2023.02); *G11C 11/221* (2013.01); *H01L 29/516* (2013.01); *H01L 29/78391* (2014.09); *H10B 53/20* (2023.02)

(58) Field of Classification Search
CPC ......... H01L 27/10808; H01L 27/11502; H01L 28/55; H01L 28/56; H01L 28/57;
(Continued)

(56) References Cited

U.S. PATENT DOCUMENTS 9,460,770 B1 * 10/2016 Nicholes ............... G11C 11/221
2009/0138070 A1   5/2009 Holzer et al.
(Continued)

FOREIGN PATENT DOCUMENTS

CN        110391236 A  * 10/2019  ........... G11C 11/221
EP         1507285 A2  *  2/2005  ............. H01L 28/56
(Continued)

OTHER PUBLICATIONS

Gaddam, Vekateswarlu, Dipjyoti Das, and Sanghun Jeon. "Insertion of $HfO_2$ Seed/Dielectric Layer to the Ferroelectric HZO Films for Heightened Remanent Polarization in MFM Capacitors."—KAIST (Jun. 27, 2019).
(Continued)

*Primary Examiner* — Matthew E Warren
(74) *Attorney, Agent, or Firm* — Harness, Dickey & Pierce, P.L.C.

(57) ABSTRACT

The present invention relates to ferroelectric capacitors, transistors, memory device, and method of manufacturing ferroelectric devices. The ferroelectric capacitor includes a first electrode, a second electrode facing the first electrode, a ferroelectric layer between the first electrode and the second electrode, and an interfacial layer between the ferroelectric layer and the first electrode or between the ferroelectric layer and the second electrode. The ferroelectric layer includes hafnium-based oxide. The interfacial layer includes $HfO_2$.

20 Claims, 22 Drawing Sheets

(51) Int. Cl.
*H01L 29/51* (2006.01)
*H01L 29/78* (2006.01)
*H10B 53/20* (2023.01)

(58) Field of Classification Search
CPC ............ H01L 29/40111; H01L 29/516; H01L 29/78391; G11C 11/22; G11C 11/221; H10B 53/00; H10B 53/20
See application file for complete search history.

(56) References Cited

U.S. PATENT DOCUMENTS

| | | | |
|---|---|---|---|
| 2017/0103988 A1 | 4/2017 | Nishida et al. | |
| 2017/0256552 A1* | 9/2017 | Schröder | H01L 27/11507 |
| 2017/0294219 A1 | 10/2017 | Nicholes et al. | |
| 2018/0374929 A1* | 12/2018 | Yoo | H01L 29/513 |
| 2019/0074295 A1* | 3/2019 | Schröder | H01L 29/40111 |
| 2019/0189627 A1 | 6/2019 | Pandey et al. | |
| 2020/0212168 A1* | 7/2020 | Yoo | H01L 29/78391 |
| 2021/0091227 A1* | 3/2021 | Heo | H01L 29/513 |

FOREIGN PATENT DOCUMENTS

| | | | | |
|---|---|---|---|---|
| EP | 2538420 A1 * | 12/2012 | ........... | H01G 4/1209 |
| WO | WO-2019066962 A1 * | 4/2019 | ............ | H01L 28/56 |

OTHER PUBLICATIONS

T. Boscke, J. Muller, D. Brauhaus, U. Schroder, and U. Bottger, "Ferroelectricity in hafnium oxide thin films," Applied Physics Letters, vol. 99, p. 102903, 2011.
M. H. Park, Y. H. Lee, H. J. Kim, Y. J. Kim, T. Moon, K. D. Kim, et al., "Ferroelectricity and antiferroelectricity of doped thin HfO2-based films," Advanced Materials, vol. 27, pp. 1811-1831, 2015.
M. H. Park, Y. H. Lee, T. Mikolajick, U. Schroeder, and C. S. Hwang, "Review and perspective on ferroelectric HfO$_2$-based thin films for memory applications," MRS Communications, vol. 8, pp. 795-808, 2018.
Z. Fan, J. Chen, and J. Wang, "Ferroelectric HfO$_2$-based materials for next-generation ferroelectric memories," Journal of Advanced Dielectrics, vol. 6, p. 1630003, 2016.
J. Muller, E. Yurchuk, T. Schlosser, J. Paul, R. Hoffmann, S. Muller, et al., "Ferroelectricity in HfO$_2$ enables nonvolatile data storage in 28 nm HKMG," in 2012 Symposium on VLSI Technology (VLSIT), 2012, pp. 25-26.
T. Mikolajick, U. Schroeder, and S. Slesazeck, "Hafnium oxide based ferroelectric devices for memories and beyond," in 2018 International Symposium on VLSI Technology, Systems and Application (VLSI-TSA), 2018, pp. 1-2.
T. Onaya. T. Nabatame, N. Sawamoto, A. Ohi, N. Ikeda, T. Chikyow, et al., "Improvement in ferroelectricity of Hf$_x$Zr$_{1-x}$O$_2$ thin films using ZrO$_2$ seed layer," Applied Physics Express, vol. 10, p. 081501, 2017.
W. Xiao, C. Liu, Y. Peng, S. Zheng, Q. Feng, C. Zhang, et al., "Performance Improvement of Hf$_{0.5}$Zr$_{0.5}$O$_2$ Based Ferroelectric-Field-Effect Transistors with ZrO$_2$ seed layers," IEEE Electron Device Letters, vol. 40, No. 5, pp. 714-717, 2019.
K. Aizawa, B.-E. Park, Y. Kawashima, K. Takahashi, and H. Ishiwara, "Impact of HfO$_2$ buffer layers on data retention characteristics of ferroelectric-gate field-effect transistors," Applied Physics Letters, vol. 85, No. 15, pp. 3199-3201, 2004.
N. Gong and T.-P. Ma, "Why is FE-HfO$_2$ more suitable than PZT or SBT for scaled nonvolatile 1-T memory cell? A retention perspective," IEEE Electron Device Letters, vol. 37, No. 9, pp. 1123-1126, 2016.
M. Si, X. Lyu, and P.D. Ye, "Ferroelectric Polarization Switching of Hafnium Zirconium Oxide in a Ferroelectric/Dielectric Stack," ACS Applied Electronic Materials, 2019, 1, pp. 745-751.
W. Jeon, S. Yoo, H. K. Kim, W. Lee, C. H. An, M. J. Chung, et al., "Evaluating the top electrode material for achieving an equivalent oxide thickness smaller than 0.4 nm from an Al-Doped TiO$_2$ film," ACS applied materials & interfaces, vol. 6, p. 21632-21637, 2014.
D. Zhou, J. Xu, Q. Li, Y. Guan, F. Cao, X. Dong, et al., "Wake-up effects in Si-doped hafnium oxide ferroelectric thin films," Applied Physics Letters, vol. 103, p. 192904, 2013.
M. Hoffmann, U. Schroeder, T. Schenk, T. Shimizu, H. Funakubo, O. Sakata, et al., "Stabilizing the ferroelectric phase in doped hafnium oxide." Journal of Applied Physics, vol. 118, p. 072006, 2015.
Y. H. Lee, S. D. Hyun, H. J. Kim, J. S. Kim, C. Yoo, T. Moon, et al., "Nucleation-Limited Ferroelectric Orthorhombic Phase Formation in Hf$_{0.5}$Zr$_{0.5}$O$_2$ Thin Films," Advanced Electronic Materials, vol. 5, p. 1800436, 2019.
M. Hyuk Park, H. Joon Kim, Y. Jin Kim, W. Lee, T. Moon, and C. Seong Hwang, "Evolution of phases and ferroelectric properties of thin Hf$_{0.5}$Zr$_{0.5}$O$_2$ films according to the thickness and annealing temperature," Applied Physics Letters, vol. 102, p. 242905, 2013.
T. Onaya, T. Nabatame, N. Sawamoto, K. Kurishima, A. Ohi, N. Ikeda, et al., "Ferroelectricity of Hf$_x$Zr$_{1-x}$O$_2$ Thin Films Fabricated Using TIN Stressor and ZrO$_2$ Nucleation Techniques," ECS Transactions, vol. 86, pp. 31-38, 2018.
M. Hyuk Park, H. Joon Kim, Y. Jin Kim, T. Moon, and C. Seong Hwang, "The effects of crystallographic orientation and strain of thin Hf$_{0.5}$Zr$_{0.5}$O$_2$ film on its ferroelectricity," Applied Physics Letters, vol. 104, p. 072901, 2014.
G. Niu, P. Calka, P. Huang, S. U. Sharath, S. Petzold, A. Gloskovskii, et al., "Operando diagnostic detection of interfacial oxygen 'breathing' of resistive random access memory by bulk-sensitive hard X-ray photoelectron spectroscopy," Materials Research Letters, vol. 7, No. 3, pp. 117-123, 2019.
Partial European Search Report dated May 14, 2021 for corresponding European Application No. 20211039.1.
C. Alessandri et al., "Experimentally Validated, Predictive Monte Carlo Modeling of Ferroelectric Dynamics and Variability", 2018.

* cited by examiner

FERROELECTRIC CAPACITORS, TRANSISTORS, MEMORY DEVICES, AND METHODS OF MANUFACTURING FERROELECTRIC DEVICES

CROSS-REFERENCE TO RELATED APPLICATION

This application claims the benefit, under 35 U.S.C. § 119, of Korean Patent Application No. 10-2019-0178508, filed on Dec. 30, 2019, in the Korean Intellectual Property Office, the disclosure of which is incorporated herein in its entirety by reference.

BACKGROUND

1. Field

The present disclosure relates to ferroelectric capacitors, ferroelectric transistors, ferroelectric memory devices, and methods of manufacturing ferroelectric capacitors.

2. Description of Related Art

Ferroelectrics are materials exhibiting ferroelectricity defined by spontaneous polarization maintained by aligning internal electric dipole moments even in the absence of an electric field. The ferroelectrics may be used in making ferroelectric devices, such as nonvolatile memory devices.

Ferroelectric materials of a perovskite structure, such as PZT, BTO, or SBT, have been applied to conventional ferroelectric devices. However, these materials have difficulty in maintaining polarization when they are used for thin films with decreasing thicknesses, ultimately hindering the achievement of a miniaturized device.

Since it has been found that hafnium-based oxides have ferroelectricity, research into ferroelectric devices has been reinvigorated. The hafnium-based oxides exhibiting ferroelectricity even in thin films have various advantages, including size reduction capability, appropriate levels of remnant polarization and coercive field, CMOS compatibility, easy fabrication of a 3-dimensional structure, and being lead-free.

Meanwhile, since operation of a ferroelectric device at a lower voltage is made possible as the remnant polarization value of the device becomes higher, there is an increasing demand for further enhancement of remnant polarization of a ferroelectric material.

SUMMARY

Provided are ferroelectric devices, including ferroelectric capacitors, ferroelectric transistors, and ferroelectric memory devices, having a high remnant polarization value, and methods of manufacturing same.

Additional aspects will be set forth in part in the description which follows and, in part, will be apparent from the description, or may be learned by practice of the presented example embodiments of the disclosure.

According to some example embodiments, a ferroelectric capacitor may include a first electrode, a second electrode facing the first electrode, a ferroelectric layer between the first electrode and the second electrode, and an interfacial layer. The interfacial layer may be between the ferroelectric layer and one electrode of the first electrode or the second electrode. The ferroelectric layer may include a hafnium-based oxide. The interfacial layer may include $HfO_2$.

The first electrode and the second electrode may each independently include TiN, TaN, $RuO_2$, Ir/IrOx, Ti, TiCN, TiSiN, WSiN, TiAlN, TaAlN, TiAlCN, Ti—W, Ru—TiN, RuCN, Pt, Au, or Al.

The first electrode and the second electrode may both include TiN.

The ferroelectric layer may include hafnium zirconium oxide (HZO), hafnium titanium oxide, or hafnium silicon oxide.

The ferroelectric layer may include an oxide further including hafnium zirconium oxide (HZO).

A ferroelectric material of the ferroelectric layer may include an o-phase having an orthorhombic crystal structure.

The ferroelectric layer may have a thickness in a range of about 50 Å to about 200 Å.

The ferroelectric capacitor may be configured to cause oxygen vacancies to be generated at interfaces of the interfacial layer and at least one of the first electrode, the second electrode, or the ferroelectric layer which contact the interfacial layer while oxygen atoms induced from the interfacial layer move between each of the interfacial layer, the first electrode, and the ferroelectric layer, or between each of the interfacial layer, the second electrode, and the ferroelectric layer.

The interfacial layer may be between the ferroelectric layer and the first electrode.

The interfacial layer may be between the ferroelectric layer and the second electrode.

The interfacial layer may include a first interfacial layer between the ferroelectric layer and the first electrode, and a second interfacial layer between the ferroelectric layer and the second electrode.

The interfacial layer may have a thickness in a range of about 5 Å to about 200 Å.

Remnant polarization of the ferroelectric capacitor may be in a range of about 15 $\mu C/cm^2$ to about 25 $\mu C/cm^2$.

According to some example embodiments, a ferroelectric field-effect transistor may include a semiconductor layer including a source region and a drain region, a ferroelectric layer on the semiconductor layer, a gate electrode on the ferroelectric layer, and an interfacial layer between the ferroelectric layer and the gate electrode. The ferroelectric layer may include a hafnium-based oxide. The interfacial layer may include $HfO_2$.

The ferroelectric layer may include hafnium zirconium oxide.

The gate electrode may include TiN.

According to some example embodiments, a ferroelectric memory device may include the ferroelectric capacitor and a field-effect transistor including a semiconductor layer including a source region and a drain region, a dielectric layer on the semiconductor layer, and a gate electrode on the dielectric layer, wherein the ferroelectric capacitor is electrically connected to the field-effect transistor.

According to some example embodiments, a method of manufacturing a ferroelectric capacitor may include forming a first electrode forming a ferroelectric layer on the first electrode, the ferroelectric layer including a hafnium-based oxide, forming a second electrode on the ferroelectric layer, and forming an interfacial layer contacting the ferroelectric layer. The interfacial layer may include $HfO_2$. Forming the interfacial layer may be performed between the forming the first electrode and the forming the ferroelectric layer, or between the forming the ferroelectric layer and the forming the second electrode.

The first electrode and the second electrode may both include TiN.

The ferroelectric layer may include hafnium zirconium oxide (HZO).

According to some example embodiments, a method of manufacturing an electronic device may include forming a ferroelectric capacitor and forming the electronic device based on incorporating the ferroelectric capacitor into an electronic device component.

The electronic device component may include at least one of a processing circuitry or a memory.

According to some example embodiments, a method of manufacturing a ferroelectric transistor may include preparing a semiconductor layer such that the semiconductor layer includes a source region and a drain region isolated from direct contact with each other, and a channel region between the source region and the drain region, forming a ferroelectric layer on the channel region of the semiconductor layer, the ferroelectric layer including a hafnium-based oxide, forming an interfacial layer on the ferroelectric layer, the interfacial layer including $HfO_2$, and forming a gate electrode on the interfacial layer.

The ferroelectric layer may include hafnium zirconium oxide.

The gate electrode may include TiN.

According to some example embodiments, a method of manufacturing an electronic device may include forming a ferroelectric transistor and forming the electronic device based on incorporating the ferroelectric transistor into an electronic device component.

The electronic device component may include at least one of a processing circuitry or a memory.

According to some example embodiments, a system for forming a ferroelectric device may include a process chamber including a pedestal or chuck configured to structurally support one or more devices or layers in the process chamber, a plurality of composition sources and a plurality of control devices, each composition source coupled to the process chamber via a separate control device, each control device configured to control a supply of a separate material held in a separate coupled composition source to the process chamber, and an electronic device. The electronic device may be configured to control at least the plurality of control devices to fabricate a ferroelectric capacitor based on forming a first electrode on the pedestal or chuck, forming a ferroelectric layer on the first electrode, the ferroelectric layer including a hafnium-based oxide, forming a second electrode on the ferroelectric layer, and forming an interfacial layer contacting the ferroelectric layer, the interfacial layer including $HfO_2$. The forming the interfacial layer may be performed between the forming the first electrode and the forming the ferroelectric layer, or between the forming the ferroelectric layer and the forming the second electrode.

The electronic device may be configured to control at least the plurality of control devices to fabricate a ferroelectric memory device that includes the ferroelectric capacitor electrically connected to a transistor, the transistor including a semiconductor layer having a source region and a drain region, a gate dielectric layer on the semiconductor layer, and a gate electrode on the gate dielectric layer, wherein the fabricating the ferroelectric memory device includes connecting a contact to the semiconductor layer and connecting the ferroelectric capacitor to the contact.

The first electrode and the second electrode may both include TiN.

The ferroelectric layer may include hafnium zirconium oxide (HZO).

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1:
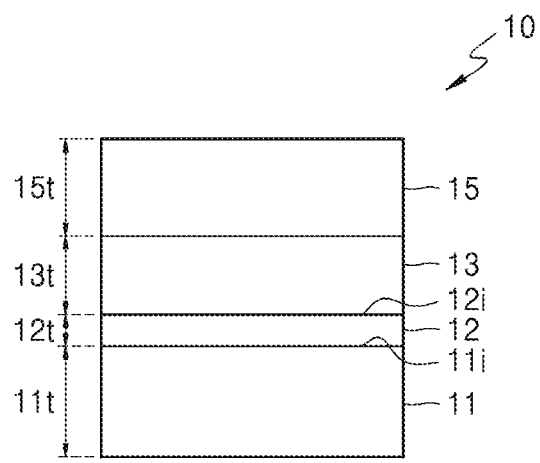
FIG. 1 is a cross-sectional view schematically illustrating a ferroelectric capacitor according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used in the description of the inventive concepts herein is for the purpose of describing particular example embodiments only and is not intended to be limiting the creative concept of the inventive concepts. As used herein, singular forms are intended to include plural forms as well, unless the context clearly indicates otherwise. It will be further understood that the terms "comprises" and/or "includes," when used in this specification, specify the presence of stated features, numbers, operations, elements, components, ingredients, materials and/or combinations thereof, but do not preclude the presence or addition of one or more other features, numbers, operations, elements, components, ingredients, materials and/or combinations thereof.

In the drawings, the thicknesses of various layers and regions are exaggerated or reduced for clarity. Throughout the specification, it will be understood that when a layer, a film, or a region is referred to as being "above" or "on" another layer, film, or region, it can be directly on the other layer, film, or region, or intervening layers, films, or regions can also be present. For example, it will be understood that, when an element is described herein to be "on" another element, the element may be "directly" on the other element, such that the element is in contact with the other element, or the element may be "indirectly" on the other element, such that the element is isolated from contact with the other element by one or more interposing structures and/or spaces.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof (e.g., structures, properties of one or more elements, lengths, distances, energy levels, energy barriers, or the like) described herein as being the "substantially" the same encompasses elements and/or properties thereof (e.g., structures, properties of one or more elements, lengths, distances, energy levels, energy barriers, or the like) that are the same within manufacturing tolerances and/or material tolerances and/or elements and/or properties thereof (e.g., structures, properties of one or more elements, lengths, distances, energy levels, energy barriers, or the like) that have a relative difference in magnitude that is equal to or less than 10%. Further, regardless of whether elements and/or properties thereof (e.g., structures, properties of one or more elements, lengths, distances, energy levels, energy barriers, or the like) are modified as "substantially," it will be understood that these elements and/or properties thereof (e.g., structures, properties of one or more elements, lengths, distances, energy levels, energy barriers, or the like) should be construed as including a manufacturing or operational tolerance (e.g., ±10%) around the stated elements and/or properties thereof (e.g., structures, properties of one or more elements, lengths, distances, energy levels, energy barriers, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Where elements, properties, or the like are described herein to have a "small" or "very small" difference between each other, it will be understood that a variation between the magnitudes of said elements and/or properties may be equal to or less than 10% of the magnitudes of the elements, properties, or the like being described.

Throughout the specification, it will be understood that, although the terms first, second, etc. may be used herein to describe various elements, these elements, should not be limited by these terms. These terms are only used to distinguish one element from another element.

It will be understood that, where an element, layer, structure, or the like is described herein to be "made of" and/or "formed of" one or more materials, the element, layer, structure, or the like may "at least partially comprise" said one or more materials.

Hereinafter, example embodiments of the present disclosure will be described in detail with reference to the accompanying drawings. In addition, in this specification and drawings, substantially the same functional components are denoted by the same reference numeral, and duplicated description will be omitted.

FIG. 1 is a cross-sectional view schematically illustrating a ferroelectric capacitor according to some example embodiments. Referring to FIG. 1, a ferroelectric capacitor 10 includes a first electrode 11 and a second electrode 15 facing each other, a ferroelectric layer 13 between the first electrode 11 and the second electrode 15, and an interfacial layer 12 between (e.g., directly or indirectly between) the first electrode 11 and the ferroelectric layer 13. The first electrode 11 and the second electrode 15 may be referred to as a lower electrode and an upper electrode, respectively.

Materials of the first electrode 11 and the second electrode 15 may each independently include TiN, TaN, $RuO_2$, Ir/IrOx, Ti, Ta, TiCN, TiSiN, WSiN, TiAlN, TaAlN, TiAlCN, TiW (Ti—W), RuTiN (Ru—TiN), RuCN, Pt, Au, or Al. The first electrode 11 and the second electrode 15 may be formed of the same material or different material from each other. For example, both of the first electrode 11 and the second electrode 15 may be formed of TiN. The first electrode 11 and the second electrode 15 may have a thickness 11$t$, 15$t$, of, for example, about 100 Å to about 2000 Å.

The material of the ferroelectric layer 13 may include hafnium-based oxide. Examples of the ferroelectric layer 13 may include, for example, hafnium zirconium oxide (HZO), hafnium titanium oxide, or hafnium silicon oxide. Specifically, the ferroelectric layer 13 may include hafnium zirconium oxide (HZO). For example, the ferroelectric layer 13 may include an oxide that further includes hafnium zirconium oxide (HZO). In some example embodiments the ferroelectric layer 13 may include a ferroelectric material that may include an o-phase having an orthorhombic crystal structure. For example, the ferroelectric layer 13 may include a hafnium-based oxide that may have an o-phase having an orthorhombic crystal structure. The ferroelectric layer 13 may have a thickness 13t in a range of about 50 Å to about 200 Å.

The interfacial layer 12 may include an oxide made from one of metallic elements forming the hafnium oxide in the ferroelectric layer 13. Specifically, the interfacial layer 12 may be formed of hafnium oxide ($HfO_2$). The interfacial layer 12 may have a thickness 12t of, for example, about 5 Å to about 200 Å.

The ferroelectricity of the hafnium oxide of the ferroelectric layer 13 may be caused by the o-phase with the orthorhombic crystal structure. Without wishing to be bound by theory, it is believed that the formation of the o-phase with an orthorhombic structure could be attributed to integrated effects such as insertion of the interfacial layer 12 of some example embodiments, the first electrode 11, and lattice mismatch between the first electrode 11 and the interfacial layer 12. Without wishing to be bound by theory, oxygen vacancies may accumulate at interfaces of the first electrode 11 (e.g., interface 11i between the top surface of the first electrode 11 and the bottom surface of the interfacial layer 12) while oxygen atoms induced from the interfacial layer 12 move between each of the interfacial layer 12, the first electrode 11 and the ferroelectric layer 13 during formation of the interfacial layer 12 and the ferroelectric layer 13. These oxygen vacancies are considered to induce higher remnant polarization to the ferroelectric layer 13 by facilitating the breakdown mechanism of the hafnium-based oxide of the ferroelectric layer 13. Therefore, the remnant polarization of the ferroelectric layer 13 can be increased by inserting the interfacial layer 12 between the first electrode 11 and the ferroelectric layer 13. In addition, the interfacial layer 12 inserted between the first electrode 11 and the ferroelectric layer 13 may reduce leakage current of the ferroelectric capacitor 10, thereby improving performance of the ferroelectric capacitor 10 and thereby improving performing of an electronic device and/or other ferroelectric device that includes the ferroelectric capacitor 10. The remnant polarization of the ferroelectric capacitor 10 may be in a range of about 15 $\mu C/cm^2$ to about 25 $\mu C/cm^2$.

Figure 2:
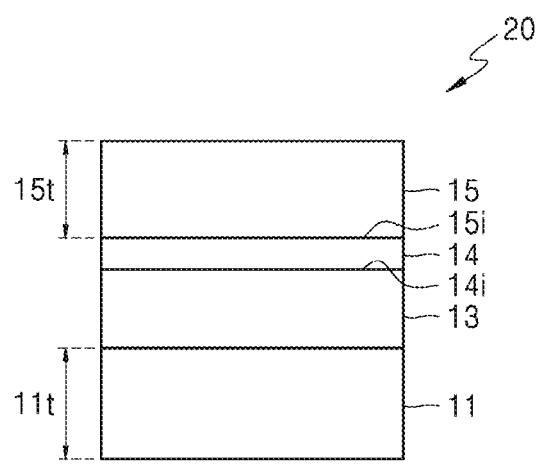
FIG. 2 is a cross-sectional view schematically illustrating a ferroelectric capacitor according to some example embodiments.

FIG. 2 is a cross-sectional view schematically illustrating a ferroelectric capacitor according to some example embodiments. Referring to FIG. 2, a ferroelectric capacitor 20 includes a first electrode 11 and a second electrode 15 facing each other, a ferroelectric layer 13 between the first electrode 11 and the second electrode 15, and an interfacial layer 14 between (e.g., directly between or indirectly between) the ferroelectric layer 13 and the second electrode 15. The ferroelectric capacitor 20 is different from the ferroelectric capacitor 10 having the interfacial layer 12 positioned between the first electrode 11 as a lower electrode and the ferroelectric layer 13 in that the interfacial layer 14 of the ferroelectric capacitor 20 is positioned between the ferroelectric layer 13 and the second electrode 15 as an upper electrode. The ferroelectric capacitor 20 has substantially the same configuration as the ferroelectric capacitor 10, except for the position of the interfacial layer 14. Accordingly, with regard to the ferroelectric capacitors 10 and 20 shown in FIGS. 1 and 2, it will be understood that a ferroelectric capacitor may include an interfacial layer that is between the ferroelectric layer 13 and one electrode of the first electrode 11 (e.g., as shown in FIG. 1) or the second electrode 15 (e.g., as shown in FIG. 2).

Without wishing to be bound by theory, it is also believed that the orthorhombic o-phase formation in hafnium-based oxide of the ferroelectric layer 13 in the ferroelectric capacitor 20 could be attributed to integrated effects such as insertion of the interfacial layer 14, the second electrode 15, and lattice mismatch between the second electrode 15 and the interfacial layer 14. Without wishing to be bound by theory, oxygen vacancies may accumulate at interfaces of the second electrode 15 (e.g., interface 15i between the bottom surface of the second electrode 15 and the top surface of the interfacial layer 14) while oxygen atoms induced from the interfacial layer 14 move between each of the interfacial layer 14, the second electrode 15 and the ferroelectric layer 13 during formation of the ferroelectric layer 13 and the interfacial layer 14. Without wishing to be bound by theory, these oxygen vacancies are considered to induce higher remnant polarization to the ferroelectric layer 13 by facilitating the breakdown mechanism of the hafnium-based oxide of the ferroelectric layer 13. Therefore, the remnant polarization of the ferroelectric layer 13 can be increased by inserting the interfacial layer 14 between the ferroelectric layer 13 and the second electrode 15. In addition, the interfacial layer 14 inserted between the ferroelectric layer 13 and the second electrode 15 may reduce leakage current of the ferroelectric capacitor 20, thereby improving performance of the ferroelectric capacitor 20 and thereby improving performing of an electronic device and/or other ferroelectric device that includes the ferroelectric capacitor 20.

The remnant polarization of the ferroelectric capacitor 20 may be in a range of about 15 $\mu C/cm^2$ to about 25 $\mu C/cm^2$.

In view of FIGS. 1 and 2, it will be understood that the ferroelectric capacitor (e.g., ferroelectric capacitor 10 and/or ferroelectric capacitor 20) may be configured to cause oxygen vacancies to be generated at interfaces of the interfacial layer (12 and/or 14) and at least one of the first electrode 11, the second electrode 15, or the ferroelectric layer 13 which contact the interfacial layer (12 and/or 14). For example, oxygen vacancies may be caused to be generated at interface 11i where the first electrode 11 and the interfacial layer 12 contact each other, at interface 12i where the ferroelectric layer 13 and the interfacial layer 12 contact each other, at interface 14i where the ferroelectric layer 13 and the interfacial layer 14 contact each other, and/or at interface 15i where the second electrode 15 and the interfacial layer 14 contact each other. Additionally, it will be understood that the ferroelectric capacitor (e.g., 10 and/or 20) may be configured to cause said oxygen vacancies to be generated while (e.g., concurrently with) oxygen atoms induced from the interfacial layer (12 and/or 14) move between each of the interfacial layer (e.g., 12), the first electrode 11 and the ferroelectric layer 13 (e.g., as shown in FIG. 1), or between each of the interfacial layer (e.g., 14), the second electrode 15, and the ferroelectric layer 13 (e.g., as shown in FIG. 2); for example, said movement of oxygen atoms may occur concurrently with the generation of the oxygen vacancies (e.g., during formation of the interfacial layer 12 and the ferroelectric layer 13).

Although not shown, the interfacial layer of a ferroelectric capacitor may optionally be present both on and under a ferroelectric layer (e.g., a ferroelectric capacitor may include both a first interfacial layer 12 between (e.g., directly between) the first electrode 11 and the ferroelectric layer 13 and a second interfacial layer 14 between (e.g., directly between) the ferroelectric layer 13 and the second electrode 15).

Figure 3:
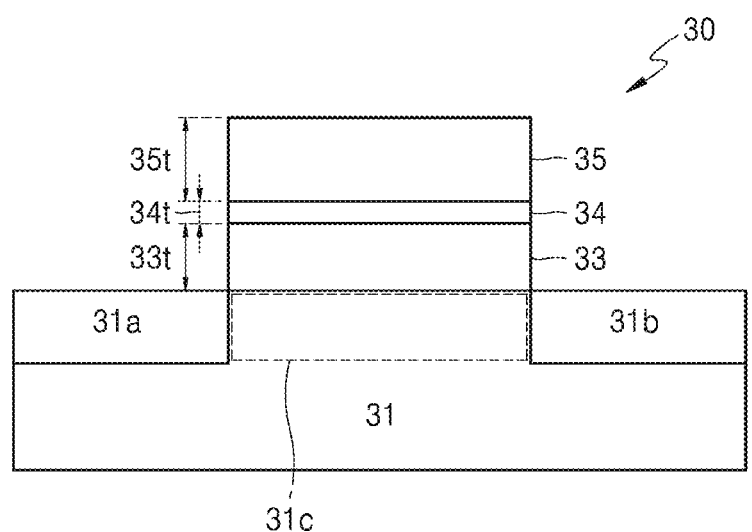
FIG. 3 is a cross-sectional view schematically illustrating a ferroelectric transistor according to some example embodiments.

FIG. 3 is a cross-sectional view schematically illustrating a ferroelectric transistor according to some example embodiments.

Referring to FIG. 3, a ferroelectric field effect transistor 30, also referred to herein interchangeably as a ferroelectric transistor, includes a semiconductor layer 31, a gate electrode 35 on (e.g., indirectly on) the semiconductor layer 31, a ferroelectric layer 33 between the semiconductor layer 31 and the gate electrode 35 (e.g., directly on the semiconductor layer 31 as shown in FIG. 3, or indirectly on the semiconductor layer 31), and an interfacial layer 34 between (e.g., directly or indirectly between) the ferroelectric layer 33 and the gate electrode 35. As shown in FIG. 3, the gate electrode 35 may be indirectly on the ferroelectric layer 33 where the interfacial layer 34 interposes therebetween, but in some example embodiments the gate electrode 35 may be directly on the ferroelectric layer 33. The semiconductor layer 31 includes a source region 31a (also referred to herein as simply a "source") and a drain region 31b (also referred to herein as simply a "drain").

In some example embodiments, a semiconductor layer as described herein may be considered to refer to portions of the semiconductor layer that exclude a channel region, source, and drain which are parts of a ferroelectric device (e.g., ferroelectric transistor 30), and such portions of the semiconductor layer may, in some example embodiments, be separate from the ferroelectric device and may be referred to herein as a "substrate." Accordingly, where a ferroelectric device includes a semiconductor layer and/or is formed at least partially within or on the semiconductor layer, one or more portions of the semiconductor layer may be referred to as a "substrate" and may be considered to be separate from the ferroelectric device.

The semiconductor layer 31 may be formed of a thin film or substrate of any arbitrary suitable semiconductor material. Examples of the semiconductor layer 31 may be formed of silicon (Si), silicon carbide (SiC), silicon germanium (SiGe), germanium (Ge), gallium arsenic (GaAs), gallium nitride (GaN), or indium phosphide (InP). A channel region 31c may be formed between the source region 31a and the drain region 31b in the semiconductor layer 31.

The ferroelectric layer 33 may be formed of a hafnium-based oxide. Specifically, the ferroelectric layer 33 may include hafnium zirconium oxide (HZO), hafnium titanium oxide or hafnium silicon oxide. For example, the ferroelectric layer 33 may be hafnium zirconium oxide (HZO). The hafnium-based oxide of the ferroelectric layer 33 may include an o-phase having an orthorhombic structure. The ferroelectric layer 33 may have a thickness 33t of, for example, about 50 Å to about 200 Å.

The interfacial layer 34 may include an oxide made from one of metallic elements forming the hafnium oxide in the ferroelectric layer 33. For example, the interfacial layer 34 may be formed of hafnium oxide ($HfO_2$). The interfacial layer 34 may have a thickness 34t of, for example, about 5 Å to about 200 Å.

The interfacial layer 34 of the ferroelectric transistor 30 may improve the remnant polarization and coercive force of the ferroelectric layer 33 while reducing leakage current, which is the same as the interfacial layers 12 and 14 of the ferroelectric transistors described above with reference to FIGS. 1 and 2.

The gate electrode 35 may be formed of TiN, TaN, $RuO_2$, Ir/IrOx, Ti, Ta, TiCN, TiSiN, WSiN, TiAlN, TaAlN, TiAlCN, TiW (Ti—W), RuTiN (Ru—TiN), RuCN, Pt, Au, or Al. For example, the gate electrode 35 may be formed of TiN. The gate electrode 35 may have a thickness 35t of, for example, about 100 Å to about 2000 Å.

Figure 4:
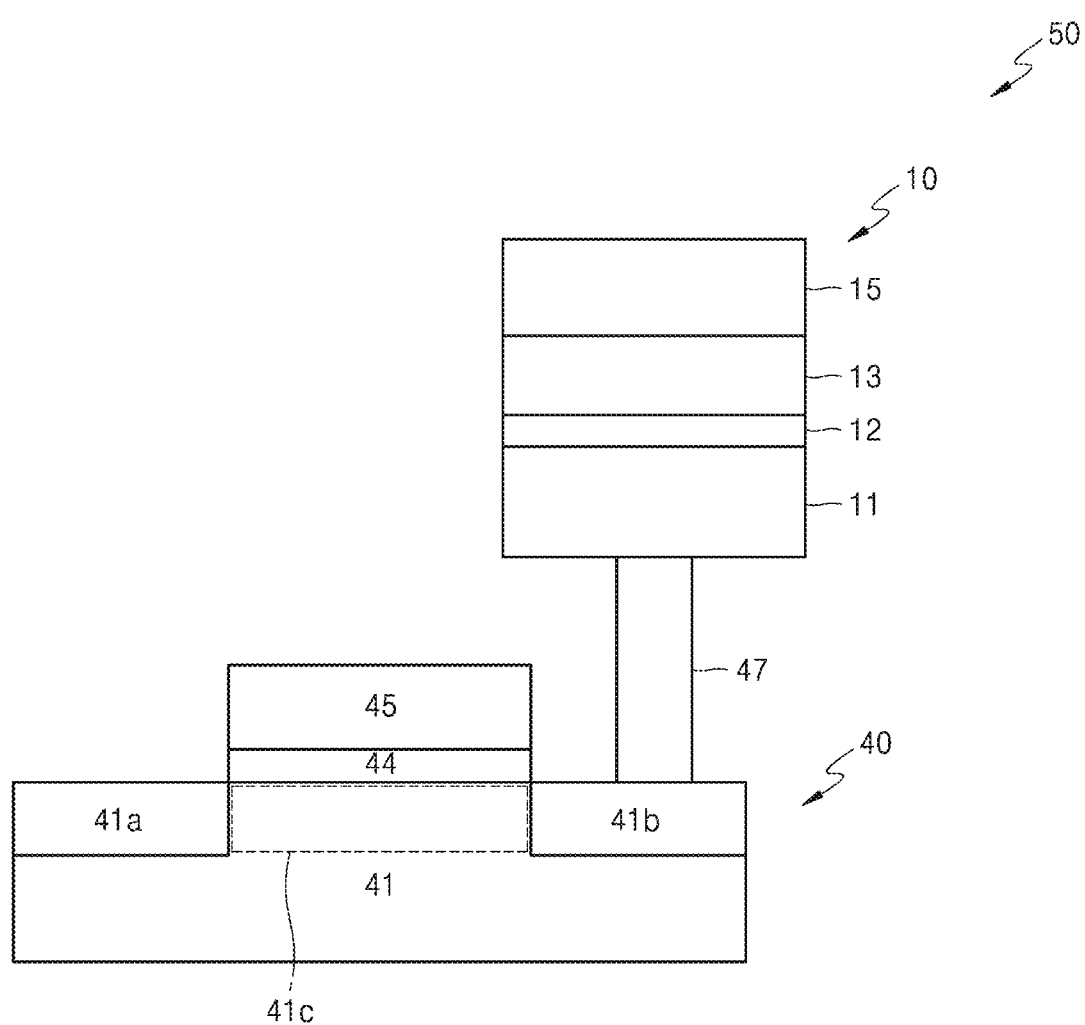
FIG. 4 is a cross-sectional view schematically illustrating a ferroelectric memory device according to some example embodiments.

FIG. 4 is a cross-sectional view schematically illustrating a ferroelectric memory device according to some example embodiments.

Referring to FIG. 4, a ferroelectric memory device 50 includes a ferroelectric capacitor 10 and a transistor 40. With regard to the ferroelectric capacitor 10, reference is made to the above description in connection with FIG. 1. The transistor 40 includes a semiconductor layer 41, a gate electrode 45 on the semiconductor layer 41 (e.g., indirectly on the semiconductor layer 41), and a gate dielectric layer 44 on the semiconductor layer 41 (e.g., directly on the semiconductor layer 41) and between (e.g., directly between) the semiconductor layer 41 and the gate electrode 45. The semiconductor layer 41 includes a source region 41a, a drain region 41b, and a channel region 41c therebetween.

The semiconductor layer 41 may be formed of any arbitrary suitable semiconductor material. Examples of semiconductor material of the semiconductor layer 41 may include silicon (Si), silicon carbide (SiC), silicon germanium (SiGe), germanium (Ge), gallium arsenic (GaAs), gallium nitride (GaN), or indium phosphide (InP). The semiconductor layer 41 may be a substrate or a thin film. A channel (not shown) may be formed between the source region 41a and the drain region 41b below the gate electrode 45.

The gate dielectric layer 44 may be formed of a suitable dielectric material. For example, the gate dielectric layer 44 may be formed of silicon oxide, zirconium oxide, hafnium oxide, or aluminum oxide.

The gate electrode 45 may be formed of a suitable conductive material. For example, the gate electrode 45 may be formed of TiN, TaN, $RuO_2$, Ir/IrOx, Ti, Ta, TiCN, TiSiN, WSiN, TiAlN, TaAlN, TiAlCN, TiW (Ti—W), RuTiN (Ru—TiN), RuCN, Pt, Au, or Al.

The ferroelectric capacitor 10 of the ferroelectric memory device 50 may be electrically connected to the transistor 40 via a contact 47, where the contact 47 directly contacts (e.g., connects) the transistor 40 and the ferroelectric capacitor 10 at opposite ends of the contact to establish the electrical connection. For example, the contact 47 may be formed of a suitable conductive material, such as tungsten, copper, aluminum, or polysilicon. The contact 47 may directly connect the drain region 41b of the transistor 40 to, for example, the lower electrode (e.g., first electrode 11) of the ferroelectric capacitor 10.

It will be understood that a ferroelectric capacitor, ferroelectric transistor, ferroelectric memory device, any combination thereof, or the like, as described herein, may be referred to as a "ferroelectric device."

Figure 5:
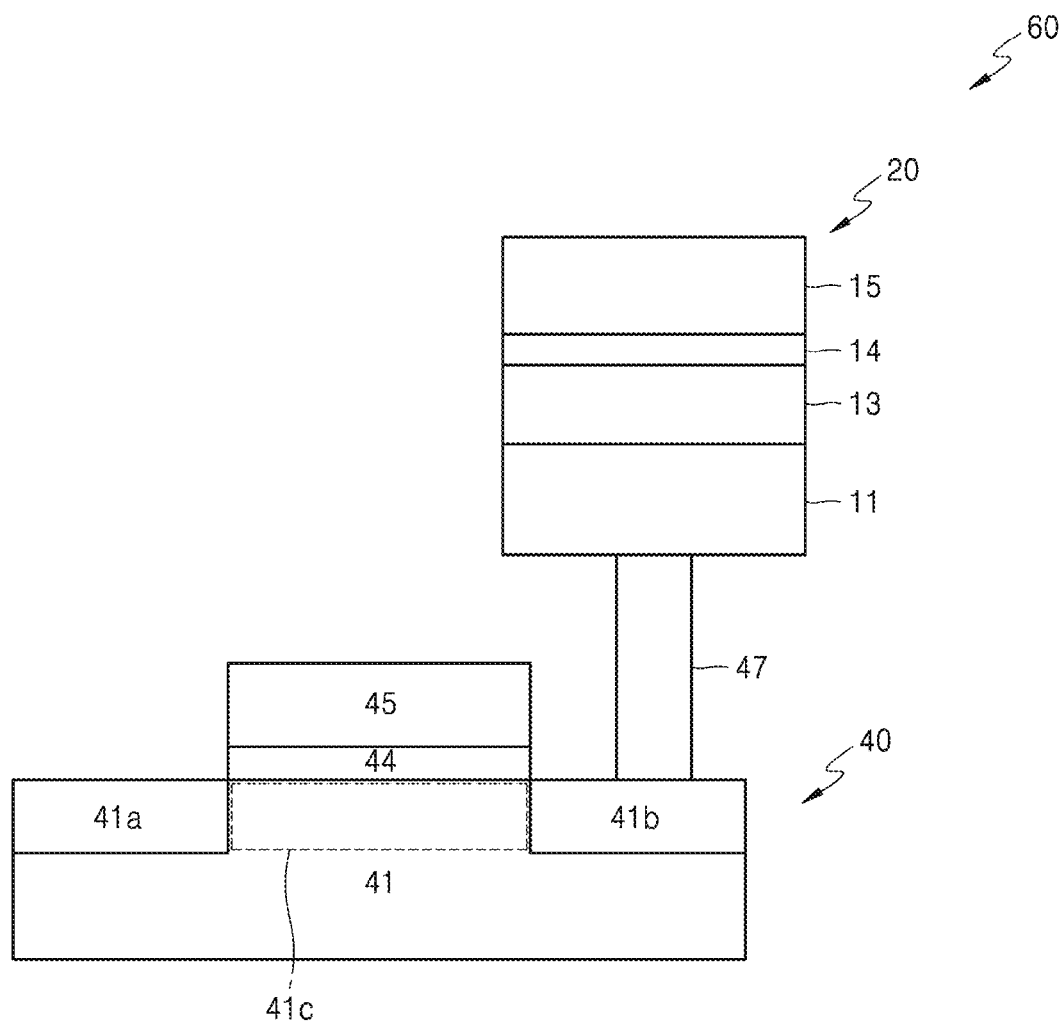
FIG. 5 is a cross-sectional view schematically illustrating a ferroelectric memory device according to some example embodiments.

FIG. 5 is a cross-sectional view schematically illustrating a ferroelectric memory device according to some example embodiments. Referring to FIG. 5, a ferroelectric memory device 60 is substantially the same as the ferroelectric memory device 50 shown in FIG. 4 in view of configuration, except that the ferroelectric capacitor 20 is used instead of the ferroelectric capacitor 10. With regard to elements of the ferroelectric memory device 60 that are the same or substantially the same as elements of the ferroelectric memory device 50, including the transistor 40 and contact 47, references is made to the above description of ferroelectric memory device 50 in connection with FIG. 4. With regard to the ferroelectric capacitor 20, reference is made to the above description in connection with FIG. 2. As described above with reference to FIG. 2, the ferroelectric capacitor 20 is different from the ferroelectric capacitor 10 having the interfacial layer 12 positioned between the first electrode 11 as a lower electrode and the ferroelectric layer 13 in that the interfacial layer 14 of the ferroelectric capacitor 20 is positioned between the ferroelectric layer 13 and the second electrode 15 as an upper electrode.

Meanwhile, the configurations of the ferroelectric capacitors 10 and 20 and the transistor 40, which have been described in connection with the ferroelectric memory devices 50 and 60, respectively, may be modified in various manners. For example, the ferroelectric capacitors 10 and 20 may be formed on the semiconductor layer 41 or may be buried in the semiconductor layer 41.

Figure 13A:
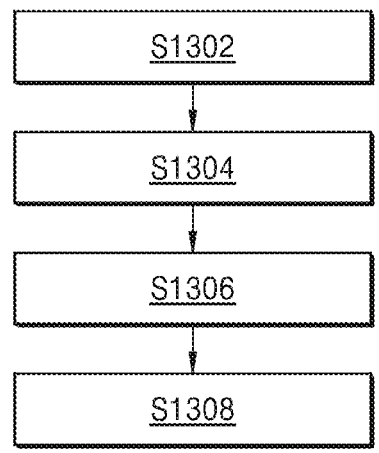
FIG. 13A is a flowchart illustrating a method for manufacturing a ferroelectric capacitor according to some example embodiments.

A fabrication method for a ferroelectric capacitor according to some example embodiments will be briefly described with reference to FIG. 13A. FIG. 13A is a flowchart illustrating a method for fabricating (referred to herein interchangeably as "manufacturing") a ferroelectric capacitor according to some example embodiments. The method shown in FIG. 13A may be implemented, in some example embodiments, by a system for manufacturing at least a ferroelectric device, including at least the system 1301 shown in FIG. 14 and/or the system 1500 shown in FIG. 16. A first electrode, an interfacial layer, a ferroelectric layer and a second electrode may be sequentially formed, thereby fabricating the ferroelectric capacitor.

Figure 14:
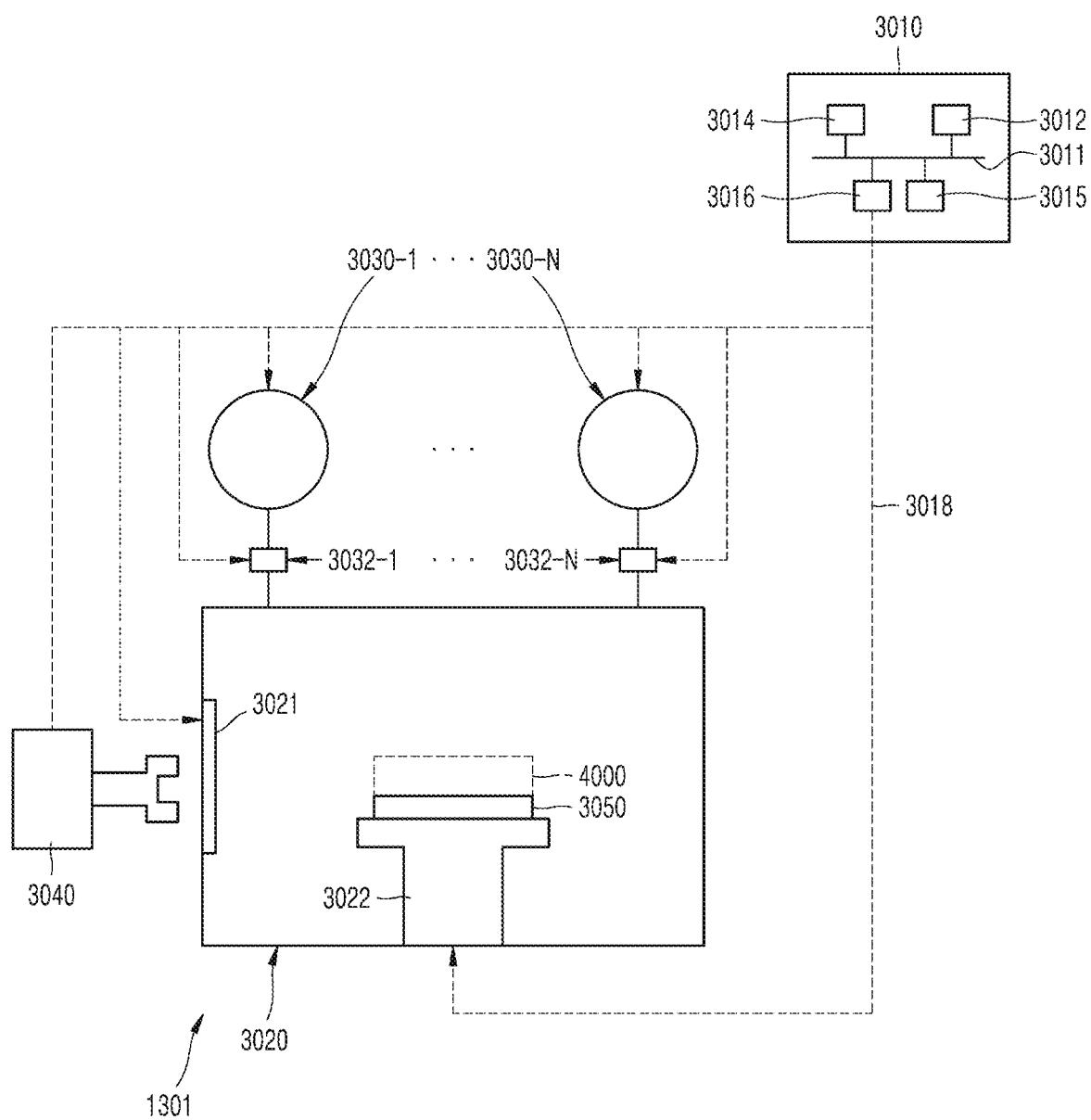
FIG. 14 shows a schematic of a system configured to control the manufacturing of a ferroelectric capacitor according to some example embodiments.

At S1302, the first electrode (e.g., first electrode 11) may be formed using a process, such as plating, sputtering or vapor deposition. Usable examples of the first electrode material include TiN, TaN, $RuO_2$, Ir/IrOx, Ti, Ta, TiCN, TiSiN, WSiN, TiAlN, TaAlN, TiAlCN, TiW (Ti—W), RuTiN (Ru—TiN), RuCN, Pt, Au, or Al. For example, the first electrode may be formed of TiN by DC sputtering. In some example embodiments, the first electrode may be formed on a substrate and/or semiconductor layer (e.g., a substrate 3050 held in a process chamber 3020 of system 1301 as shown in FIG. 14).

At S1304, the interfacial layer (e.g., interfacial layer 12 and/or interfacial layer 14) may be formed on the first electrode (e.g., first electrode 11), where the interfacial layer (12 and/or 14) contacts the ferroelectric layer 13, using a process, such as vapor deposition or atomic layer deposition (ALD). As a material of the interfacial layer, an oxide made from one of metal elements forming the hafnium oxide in the ferroelectric layer may be used. For example, the interfacial layer may be formed of hafnium oxide ($HfO_2$). The interfacial layer may be formed to a thickness of, for example, about 5 Å to about 200 Å.

At S1306, the ferroelectric layer (e.g., ferroelectric layer 13) may be formed on the interfacial layer (e.g., interfacial layer 12) using a process, such as vapor deposition or atomic layer deposition (ALD). Hafnium-based oxide may be used as a material for forming the ferroelectric layer. Specifically, the ferroelectric layer may be formed of hafnium zirconium oxide (HZO), hafnium titanium oxide or hafnium silicon oxide. For example, the ferroelectric layer may be formed of hafnium zirconium oxide (HZO). The ferroelectric layer may be formed to a thickness of, for example, about 50 Å to about 200 Å.

At S1308, the second electrode (e.g., second electrode 15) may be formed on the ferroelectric layer (e.g., ferroelectric layer 13) using the same process as used at S1302 to form the first electrode. The second electrode may be formed of the same material as or different material from the first electrode. For example, a TiN layer as the second electrode may be formed by DC sputtering.

It will be understood that, in some example embodiments, the operations of the method illustrated and described with reference to FIG. 13A may be implemented in a different order than shown in FIG. 13A. It will be understood that, in some example embodiments, at least some of the operations illustrated and described with reference to FIG. 13A may be omitted from the method.

It will be understood that, in some example embodiments, one or more operations may be added to the operations of the method that are illustrated and described with reference to FIG. 13A. For example, the method may include further operations to fabricate a ferroelectric device that includes the ferroelectric capacitor formed according to the method shown in FIG. 13A, including forming the transistor 40 shown in FIGS. 4-5 and further providing the ferroelectric capacitor on the semiconductor layer 41 of the transistor 40 (e.g., via forming contact 47 on the semiconductor layer 41 as shown in FIGS. 4-5 and further providing the ferroelectric capacitor directly on the contact 47 as shown in FIGS. 4-5) or fabricating the transistor 40 such that the ferroelectric capacitor is within the semiconductor layer 41, in order to form a ferroelectric memory device.

A fabrication method for a ferroelectric capacitor according to some example embodiments may comprise sequentially forming a first electrode, an interfacial layer, a ferroelectric layer and a second electrode contacting the ferroelectric layer, as illustrated in FIG. 13A, to form a ferroelectric capacitor according to some example embodiments, including the ferroelectric capacitor 10 shown in FIG. 1. The ferroelectric capacitor of some example embodiments may be fabricated by the same method as the fabrication method according to the example embodiments shown in FIG. 13A, except for forming the interfacial layer after forming of the ferroelectric layer and before forming the second electrode. Restated, in some example embodiments, operation S1304 may be performed between operations S1306 and S1308 (e.g., after S1306 and before S1308) instead of being performed between operations S1302 and S1306 (e.g., after S1302 and before S1306) as shown in FIG. 13A, to form a ferroelectric capacitor according to some example embodiments, including the ferroelectric capacitor 20 shown in FIG. 2.

Figure 13B:
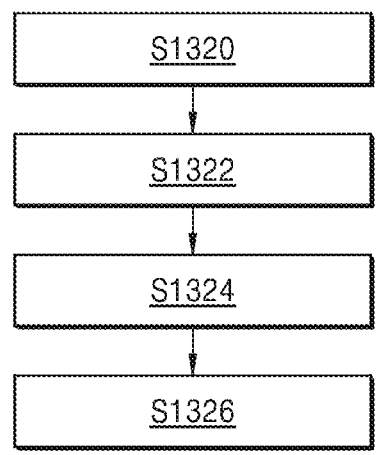
FIG. 13B is a flowchart illustrating a method for manufacturing a ferroelectric transistor according to some example embodiments.

A fabrication method for a ferroelectric transistor according to some example embodiments will be briefly described with reference to FIG. 13B. FIG. 13B is a flowchart illustrating a method for manufacturing a ferroelectric transistor according to some example embodiments. The method shown in FIG. 13B may be implemented, in some example embodiments, by a system for manufacturing at least a ferroelectric device, including at least the system 1301 shown in FIG. 14 and/or the system 1500 shown in FIG. 16.

At S1320, a semiconductor layer (e.g., semiconductor layer 31) including a channel region (e.g., channel region 31c) is provided (e.g., the semiconductor layer 31 is prepared), which may include causing the channel region to be formed to cause the semiconductor layer to include the channel region. In some example embodiments, the semiconductor layer may at least partially serve as a substrate upon which a remainder of the ferroelectric transistor is formed, and in some example embodiments at least a portion of the semiconductor layer may be considered to be a substrate that is separate from the ferroelectric transistor.

The channel region may include at least one of silicon (Si), silicon carbide (SiC), silicon germanium (SiGe), germanium (Ge), gallium arsenic (GaAs), gallium nitride (GaN), or indium phosphide (InP).

A source region (e.g., 31a) and a drain region (e.g., 31b) may be formed by injecting a dopant into two separate regions that are apart from each other (e.g., isolated from direct contact with each other) on the semiconductor layer (e.g., semiconductor layer 31), and an area of the semiconductor layer between the source and the drain may be defined to be the channel region (e.g., 31c). The dopants injected into the separate regions to form the source and the drain may be the same dopant material (the dopants injected into the separate regions may have the same material composition) or may be different dopant materials having different material compositions. Accordingly, in some example embodiments, preparing a semiconductor layer including a channel region may include injecting the dopants to form the source and the drain into the two separate regions of the semiconductor layer that are isolated from contact with each other to thus define the channel region as a region external to and between the source and the drain in the semiconductor layer. The source and the drain may be formed at S1320, but the present disclosure is not limited thereto, and the source and the drain may be formed in any subsequent operations. In some example embodiments, the operation of preparing the semiconductor layer at S1320 may be performed externally to a system that performs the remaining operations of the method shown in FIG. 13B, such that a pre-prepared semiconductor layer having at least the channel region (and, in some example embodiments, further including the source and/or drain) may be provided to, e.g., system 1301 so that the system 1301 may cause the remaining operations of the method shown in FIG. 13B to be performed to form the ferroelectric transistor 30. In some example embodiments, the operation of preparing the semiconductor layer at S1320 may be performed by one or more portions of the system that performs the remaining operations of the method shown in FIG. 13B (e.g., system 1301 may perform the operation of preparing the semiconductor layer while the semiconductor layer is within the process chamber 3020 and supported on the chuck 3022 therein, for example based on electronic device 3010 controlling one or more control devices 3032-1 to 3032-N to inject the dopants into the two separate regions of the semiconductor layer that are isolated from contact with each other to form the source and drain and thus form the channel region as the region in the semiconductor layer that is defined between the source and drain).

At S1322, a ferroelectric layer (e.g., ferroelectric layer 33) is formed on the semiconductor layer (e.g., 31), for example on (e.g., directly on) a channel region of the semiconductor layer (e.g., 31c). The ferroelectric layer may be formed using a process, such as vapor deposition or atomic layer deposition (ALD). Hafnium-based oxide may be used as a material for forming the ferroelectric layer, such that the ferroelectric layer includes a hafnium-based oxide. Specifically, the ferroelectric layer may be formed of hafnium zirconium oxide (HZO), hafnium titanium oxide or hafnium silicon oxide. For example, the ferroelectric layer 33 may be hafnium zirconium oxide (HZO). The hafnium-based oxide of the ferroelectric layer 33 may include an o-phase having an orthorhombic structure. The ferroelectric layer 33 may have a thickness of, for example, about 50 Å to about 200 Å.

At S1324, an interfacial layer (e.g., interfacial layer 34) may be formed on (e.g., directly on) the ferroelectric layer (e.g., ferroelectric layer 33), for example using a process, such as vapor deposition or atomic layer deposition (ALD). As a material of the interfacial layer, an oxide made from one of metal elements forming the hafnium oxide in the ferroelectric layer may be used. For example, the interfacial layer may be formed of hafnium oxide ($HfO_2$). The interfacial layer may be formed to a thickness of, for example, about 5 Å to about 200 Å.

At S1326, a gate electrode (e.g., gate electrode 35) may be formed on (e.g., directly on) the interfacial layer (e.g., interfacial layer 34), for example using a process, such as vapor deposition or atomic layer deposition (ALD). The gate electrode may be formed of TiN, TaN, $RuO_2$, Ir/IrOx, Ti, Ta, TiCN, TiSiN, WSiN, TiAlN, TaAlN, TiAlCN, TiW (Ti—W), RuTiN (Ru—TiN), RuCN, Pt, Au, or Al. For example, the gate electrode may be formed of TiN. The gate electrode may have a thickness of, for example, about 100 Å to about 2000 Å.

It will be understood that, in some example embodiments, the operations of the method illustrated and described with reference to FIG. 13B may be implemented in a different order than shown in FIG. 13B. It will be understood that, in some example embodiments, at least some of the operations illustrated and described with reference to FIG. 13B may be omitted from the method.

It will be understood that, in some example embodiments, one or more operations may be added to the operations of the method that are illustrated and described with reference to FIG. 13B. For example, the method may include further operations to fabricate a ferroelectric device that includes the ferroelectric transistor, including forming a ferroelectric capacitor according to any of the example embodiments, including the method described with reference to FIG. 13A, and further providing the ferroelectric capacitor on the semiconductor layer of the ferroelectric transistor formed according to the method described with reference to FIG. 13B (e.g., via forming contact 47 on the semiconductor layer 31 as shown in FIG. 3 and further providing the ferroelectric capacitor directly on the contact 47 as shown in FIGS. 4-5) or adding additional operations corresponding to some or all of the operations shown in FIG. 13A, to the method shown in FIG. 13B so to form the ferroelectric capacitor according to some example embodiments within the semiconductor layer of the ferroelectric transistor, in order to form a ferroelectric memory device.

In some example embodiments, a method for fabricating a ferroelectric device (e.g., ferroelectric memory devices 50 and/or 60) may include performing at least some of the operations of the method shown in FIG. 13B to form a transistor 40. For example, the method may include preparing the semiconductor layer 41 according to an operation similar to S1320, forming a gate dielectric layer 44 on the semiconductor layer 41 according to an operation that may be similar to S1322 and/or S1324 except to form a layer formed of a suitable dielectric material, for example silicon oxide, zirconium oxide, hafnium oxide, or aluminum oxide, for example using a process, such as vapor deposition or atomic layer deposition (ALD), directly on the semiconductor layer 41, and forming a gate electrode 45 on the gate dielectric layer 44 via an operation similar to via S1326 to form a gate electrode on the gate dielectric layer. Such a method may further include forming a ferroelectric capacitor (e.g., 10 and/or 20) according to operations similar to the operations S1302-S1308 shown in FIG. 13A, and/or coupling the ferroelectric capacitor to the transistor 40 via a contact 47 to electrically connect the ferroelectric capacitor to the transistor 40, for example as shown in FIGS. 4-5.

Test Example 1

A ferroelectric capacitor, including layers formed of TiN (1000 Å)/$HfO_2$ (10 Å)/HZO (100 Å)/TiN (250 Å), was fabricated.

The TiN layer was formed as a lower electrode to a thickness of 1000 Å by DC sputtering. The $HfO_2$ layer was deposited on the TiN layer as an interfacial layer to a thickness of 10 Å by atomic layer deposition (ALD). The HZO layer was deposited on the HfO₂ layer as a ferroelectric layer to a thickness of 100 Å by atomic layer deposition (ALD). Here, HfO and ZrO were deposited layer by layer at a temperature of 300° C. at a rate of 1 Å/cycle, thereby consequently obtaining the HZO layer. An atom ratio of hafnium to zirconium of the obtained HZO layer is about 1:1. For deposition of the HZO layer, tetrakis (ethylmethylamide) hafnium (IV) (TEMAHf) was used as a precursor of Hf, tetrakis (ethylmethylamide) zirconium (IV) (TEMAZr) was used as a precursor of Zr, and ozone gas was used as an oxygen source. The TiN layer was formed on the HZO layer as an upper electrode to a thickness of 250 Å by DC sputtering.

Subsequently, the upper TiN layer was etched using a 40° C. NH₄OH:H₂O₂:H₂O solution of 1:2:5 (molar ratio), thereby forming an upper electrode. The resulting structure having the upper electrode was subjected to rapid thermal annealing (RTA) at 600° C. for 10 seconds in a nitrogen atmosphere, thereby crystallizing the HZO layer.

Test Example 2

A ferroelectric capacitor was fabricated in the same manner as in Test Example 1, except that a HfO₂ layer was formed to a thickness of 25 Å.

Test Example 3

A ferroelectric capacitor was fabricated in the same manner as in Test Example 1, except that a HfO₂ layer was formed to a thickness of 50 Å.

Test Example 4

A ferroelectric capacitor was fabricated in the same manner as in Test Example 1, except that a HfO₂ layer was formed to a thickness of 100 Å.

Test Example 5

A ferroelectric capacitor was fabricated in the same manner as in Test Example 1, except that a HfO₂ layer was formed to a thickness of 200 Å.

Test Example 6

A ferroelectric capacitor was fabricated in the same manner as in Test Example 1, except that a HfO₂ layer was formed on a HZO layer to a thickness of 10 Å.

Comparative Example 1

A ferroelectric capacitor was fabricated in the same manner as in Test Example 1, except that a HfO₂ layer was not formed.

Property Evaluation Apparatus

The thicknesses of HZO layers were measured using an ellipsometer (SE MG-1000, Nano View), and crystal structures of the HZO layers were determined by grazing incidence X-ray diffraction (GIXRD) (SmartLab, Rigaku). X-ray photoelectron spectroscopy (XPS) spectra were recorded using a K-alpha (Thermo VG, U.K.) under conditions of a monochromic Al X-ray radiation (Al Kα line: 1486.6 eV), 12 kV, and 3 mA in an ultravacuum atmosphere of $2.9 \times 10^{-9}$ mbar at a base pressure. Polarization versus electric field (P-E) hysteresis curves were obtained using a ferroelectricity tester (Precision LC II, Radiant Technologies) after wake-up cycling of 104 times. Pulse switching transient currents were measured using a parameter analyzer (Keithley 4200, Tektronix).

Electrical Properties

Figure 6:
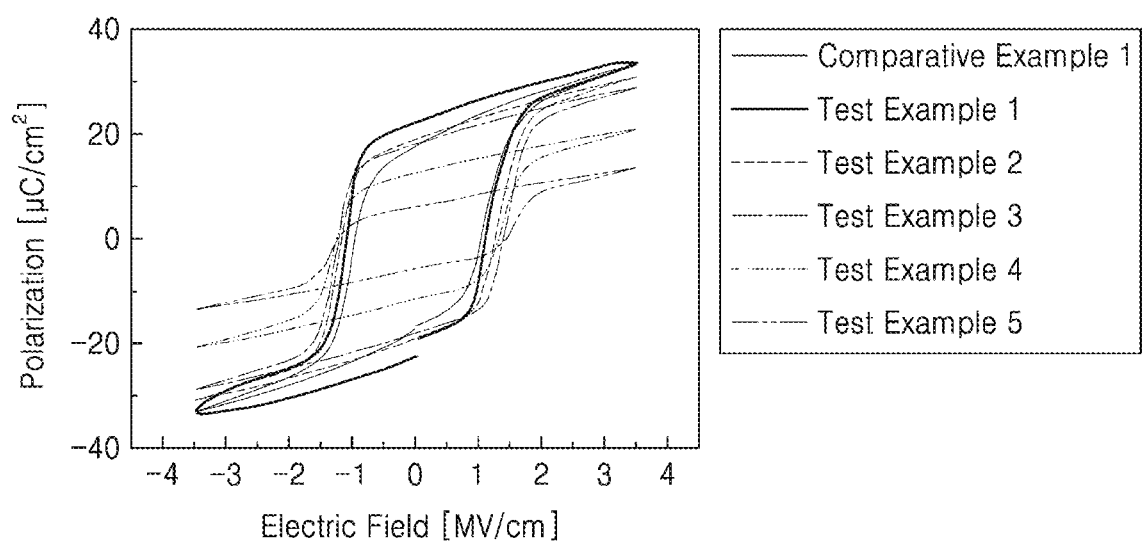
FIG. 6 illustrates hysteresis curves of polarization versus electric field of ferroelectric capacitors of Test Examples 1 to 5 and Comparative Example 1.
Figure 7:
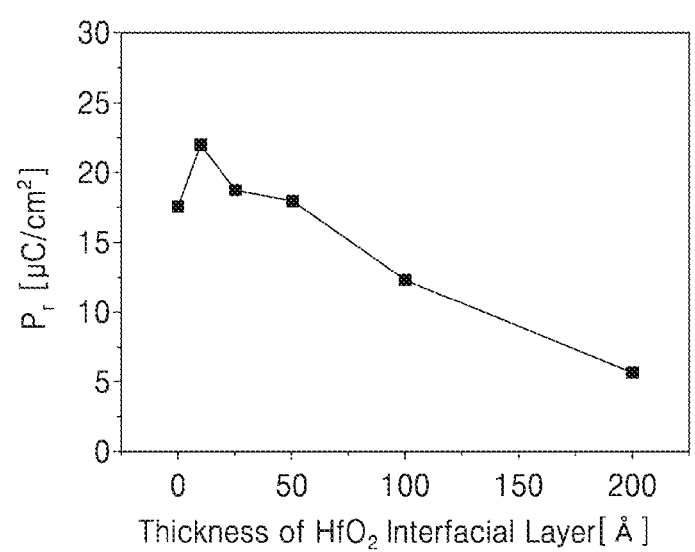
FIG. 7 is a graph showing the remnant polarization according to the thickness of a lower $HfO_2$ interfacial layer.

FIG. 6 illustrates polarization versus electric field hysteresis curves of ferroelectric capacitors of Test Examples 1 to 5 and Comparative Example 1, and FIG. 7 is a graph showing the remnant polarization depending on the thickness of a lower HfO₂ interfacial layer. Referring to FIGS. 6 and 7, ferroelectric capacitors including 10 Å, 25 Å and 50 Å thick HfO₂ interfacial layers demonstrated higher remnant polarization values, leading to better ferroelectricity, than the ferroelectric capacitors of Comparative Example 1 in which no HfO₂ interfacial layer is used. However, ferroelectric capacitors including 100 Å and 200 Å thick HfO₂ interfacial layers demonstrated considerably reduced the remnant polarization values, compared to the ferroelectric capacitors of Comparative Example 1. The highest remnant polarization value was 22.1 $\mu C/cm^2$ when the thickness of an HfO₂ interfacial layer was 10 Å. The ferroelectric capacitor including a 200 Å thick HfO₂ interfacial layer demonstrated the lowest remnant polarization value of 5.77 $\mu C/cm^2$. The ferroelectric capacitor of Comparative Example 1, in which a HfO₂ interfacial layer was not used, had a remnant polarization value of 17.7 $\mu C/cm^2$. The increased remnant polarization values of the ferroelectric capacitors of Test Examples 1 to 3 could be presumably attributed to the operation of a HfO₂ interfacial layer having an appropriate thickness as a nuclear layer capable of enhancing the o-phase formation in a ferroelectric layer while suppressing the m-phase formation. Meanwhile, the decreased remnant polarization values of the ferroelectric capacitors of Test Examples 4 and 5 are considered to be attributed to involvement of the depolarization field of a ferroelectric layer.

Figure 8:
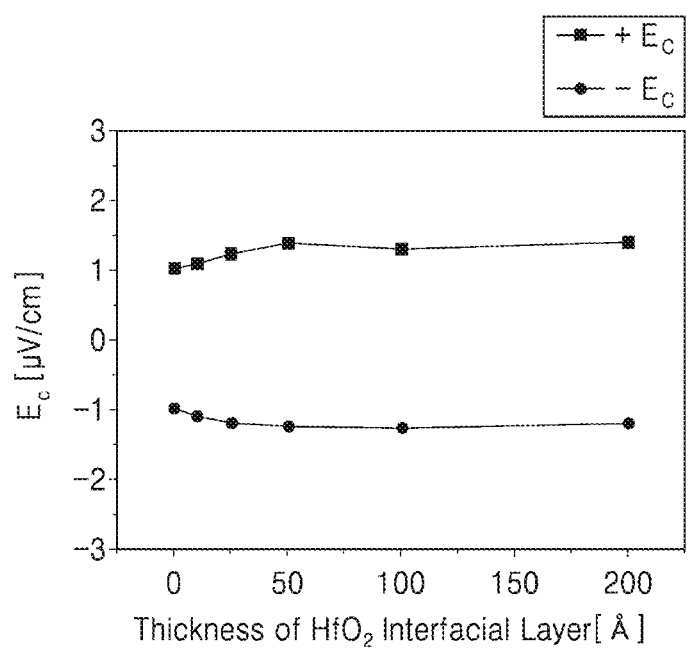
FIG. 8 is a graph showing the coercive field according to the thickness of a lower $HfO_2$ interfacial layer.

FIG. 8 is a graph showing coercive fields according to the lower HfO₂ interfacial layer thicknesses, as obtained from FIG. 6. Referring to FIG. 8, the coercive field increases according to the increase in the thickness of a HfO₂ interfacial layer to 10 Å, 25 Å and 50 Å. When the thickness of a HfO₂ interfacial layer was 10 Å, the coercive field of the ferroelectric capacity was 1.1 MV/cm, which is larger than that of the ferroelectric capacitor of Comparative Example 1, i.e., 1.04 MV/cm. Table 1 summarizes values of remnant polarization ($P_r$) and coercive field ($E_c$) of Test Examples 1 to 6 and Comparative Example 1.

TABLE 1

| | Interfacial layer | Remnant polarization ($P_r$) [$\mu C/cm^2$] | Coercive field (Ec) (MV/cm) |
|---|---|---|---|
| Test Example 1 | Lower HfO₂ (10 Å) | 22.1 | 1.11 |
| Test Example 2 | Lower HfO₂ (45 Å) | 18.91 | 1.25 |
| Test Example 3 | Lower HfO₂ (50 Å) | 18.1 | 1.40 |
| Test Example 4 | Lower HfO₂ (100 Å) | 12.47 | 1.31 |
| Test Example 5 | Lower HfO₂ (400 Å) | 5.77 | 1.42 |
| Test Example 6 | Upper HfO₂ (10 Å) | 19.63 | 1.10 |
| Comparative Example 1 | — | 17.7 | 1.04 |

Figure 9:
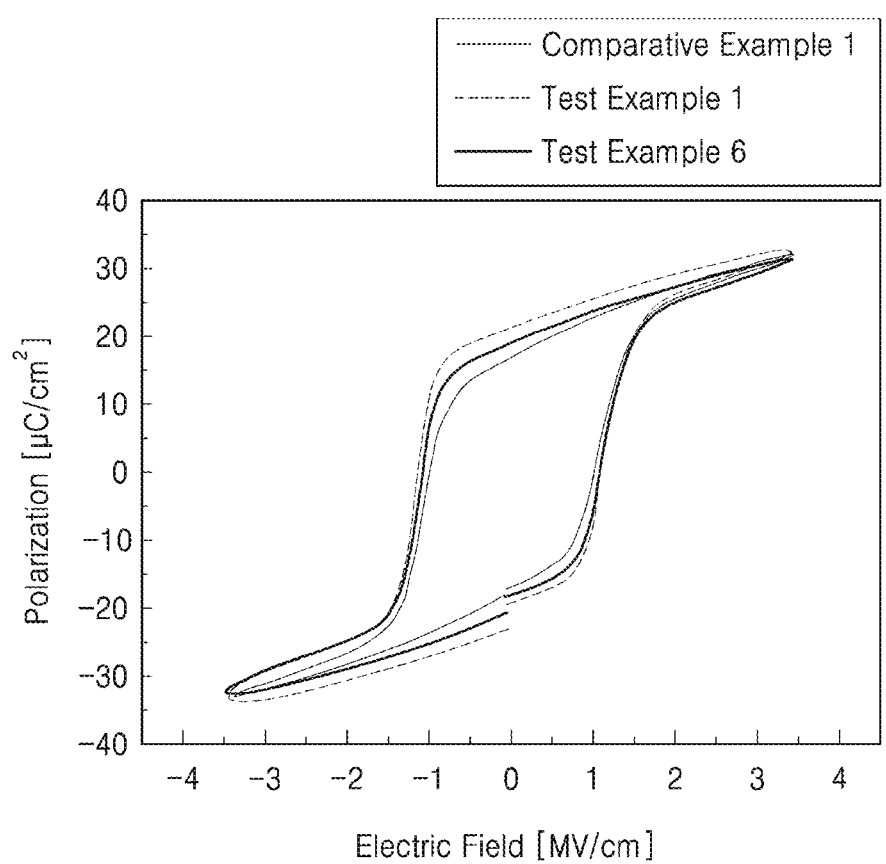
FIG. 9 illustrates hysteresis curves of polarization versus electric field of ferroelectric capacitors of Test Examples 1 and 6 and Comparative Example 1.

FIG. 9 illustrates polarization versus electric field hysteresis curves of ferroelectric capacitors of Test Examples 1 and 6 and Comparative Example 1. In FIG. 9, in both cases when a HfO₂ interfacial layer is positioned under a ferroelectric layer (Test Example 1) and when a HfO₂ interfacial layer is positioned over a ferroelectric layer (Test Example 6), higher values of remnant polarization ($P_r$) were exhibited than in a case when a HfO₂ interfacial layer is not used (Comparative Example 1). Without wishing to be bound by theory, the improved remnant polarization ($P_r$) and coercive field ($E_c$) in a ferroelectric capacitor having a $HfO_2$ interfacial layer are believed to be attributed to the reduced built-in field and domain depinning, which are caused by redistribution or gradual removal of charges moving around the interface between a ferroelectric layer and an electrode. Meanwhile, the improved coercive field may help improved retention of data in a ferroelectric transistor (FeFET).

Figure 10A:
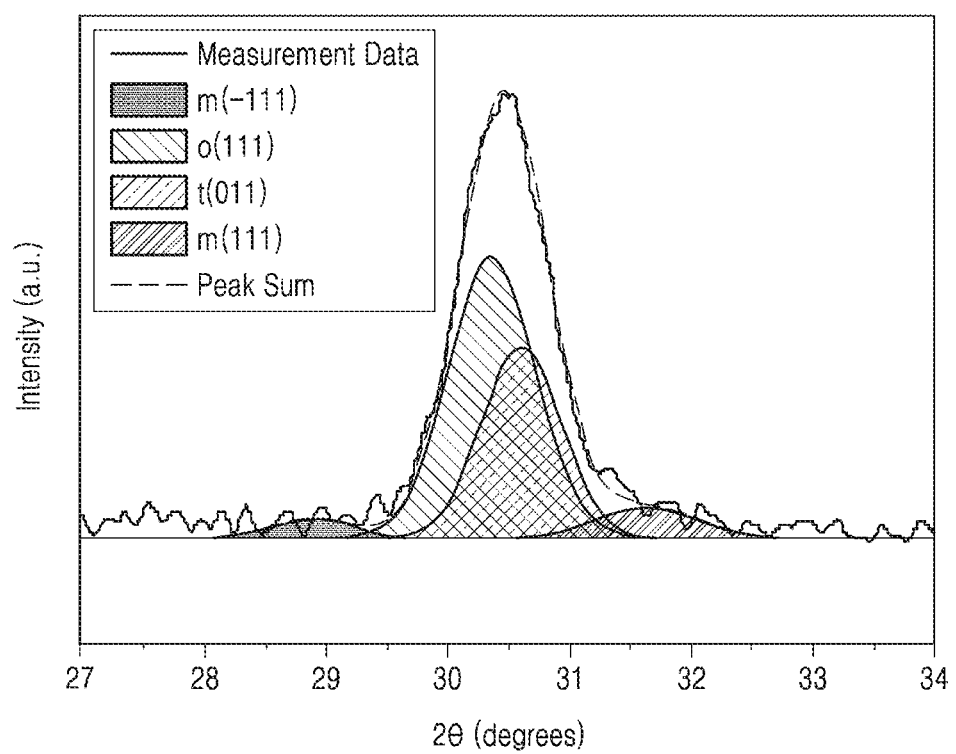
FIG. 10A illustrates GIXRD patterns of a ferroelectric layer of Test Example 1.
Figure 10B:
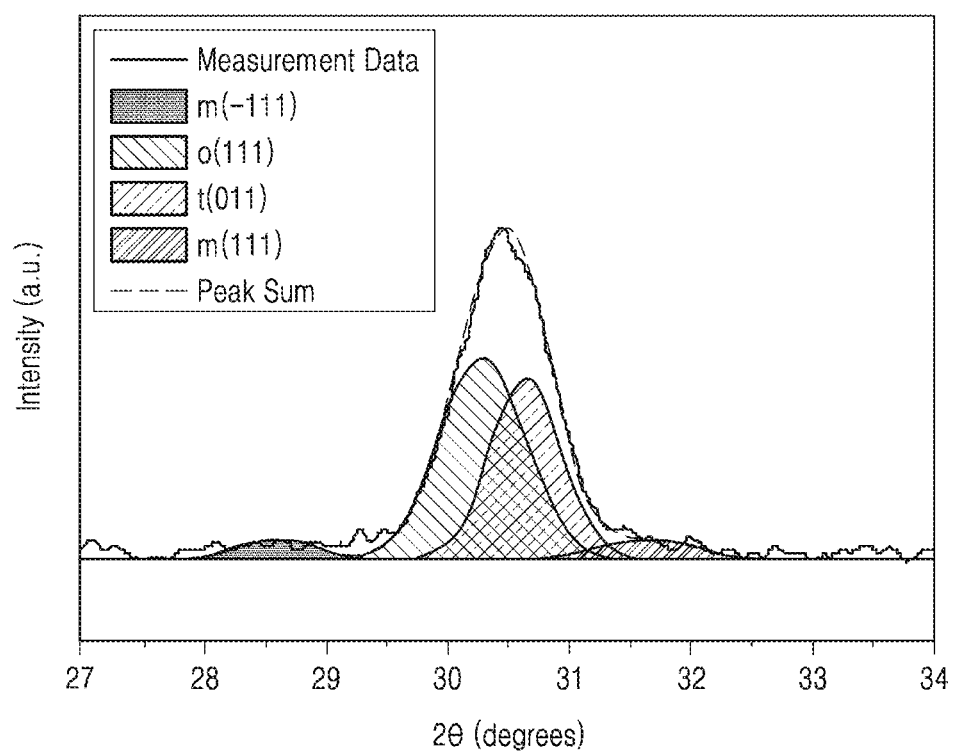
FIG. 10B illustrates GIXRD patterns of a ferroelectric layer of Test Example 6.
Figure 10C:
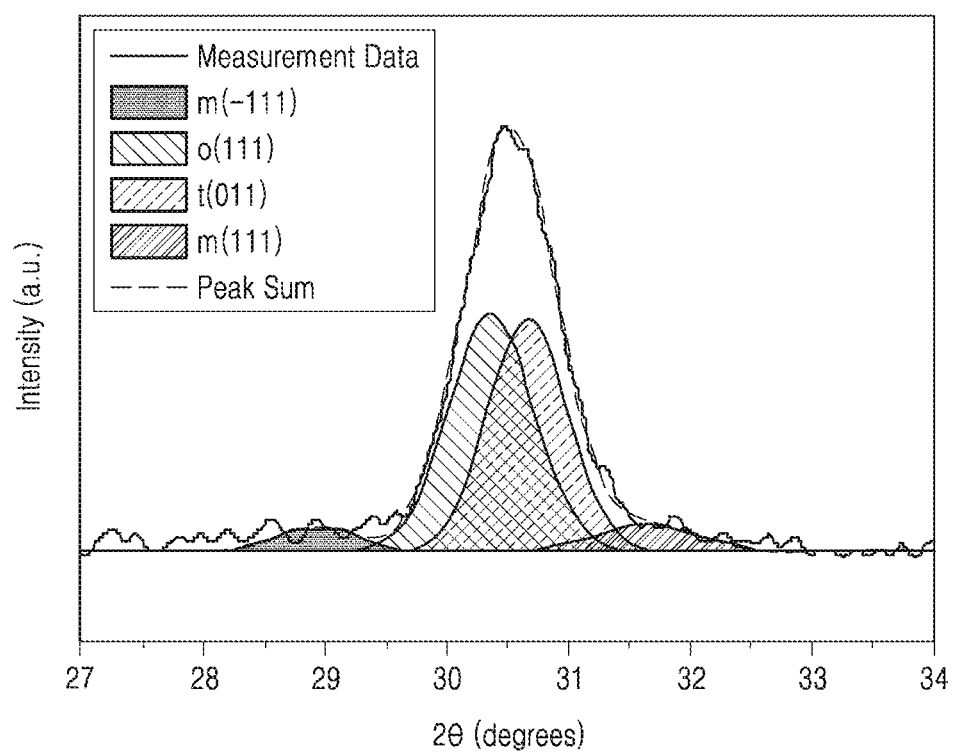
FIG. 10C illustrates GIXRD patterns of a ferroelectric layer of Comparative Example 1.

FIGS. 10A, 10B and 10C illustrate GIXRD patterns of ferroelectric layers of Test Examples 1 and 6 and Comparative Example 1, respectively.

Referring to FIGS. 10A to 10B, diffraction peaks are present at 28.6°, 30.36°, 30.67° and 31.6°. It is reported that the peak at 30.5° belongs to t-/o-phases (0111110) of HZO, and peaks at 28.6° and 31.6° belong to m-phase ($-111_m$/$111_m$). Although there is no direct determination method for the peak position of t-phase (011) HZO, the peak position of the t-phase (011) HZO film was determined to be 30.8° according to the Vegard's law. Therefore, as can be understood from the patterns shown in FIGS. 10A to 10C, peaks at 28.6° and 31.6° belong to m-phase, and peaks obtained at 30.36° and 30.67° belong to o-phase (111) and t-phase (011), respectively.

The GIXRD patterns shown in FIGS. 10A to 10C were deconvoluted into the peaks corresponding to o/t- and m-phases, then the integrated areas of the respective deconvoluted peaks were obtained. Based on the obtained area integration, the relative area ratios were quantitatively analyzed, and the results are summarized in Table 2.

lower or upper electrodes and $HfO_2$ interfacial layer, interfacial effects at the lower or upper electrodes and annealing process can lead into Improved o-phase formation in the ferroelectric HZO layer.

Test Example 7

A 10 Å thick $HfO_2$ layer and a 25 Å thick HZO layer were sequentially formed on a TiN substrate by ALD.

Comparative Example 2

A 25 Å thick HZO layer was formed on a TiN substrate by ALD.

Figure 11A:
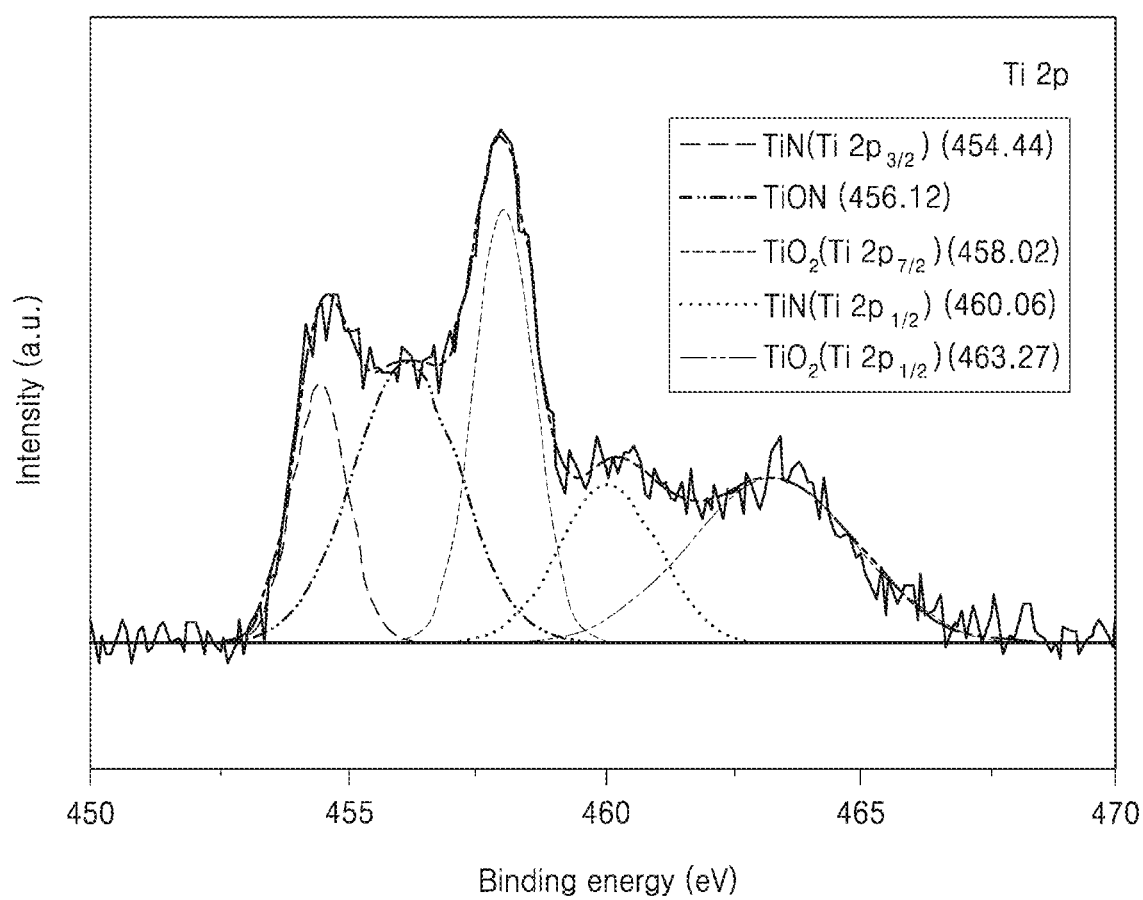
FIG. 11A illustrates XPS spectra for Ti 2p portions of samples of Test Example 7.
Figure 11B:
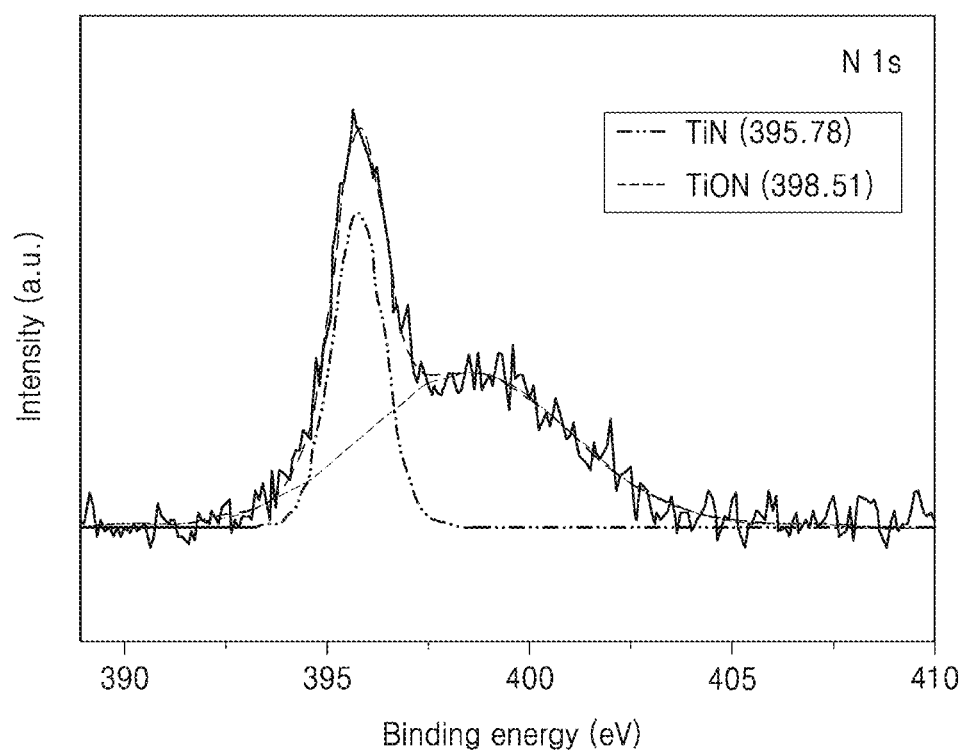
FIG. 11B illustrates XPS spectra for N 1s portions of the samples of Test Example 7.
Figure 12A:
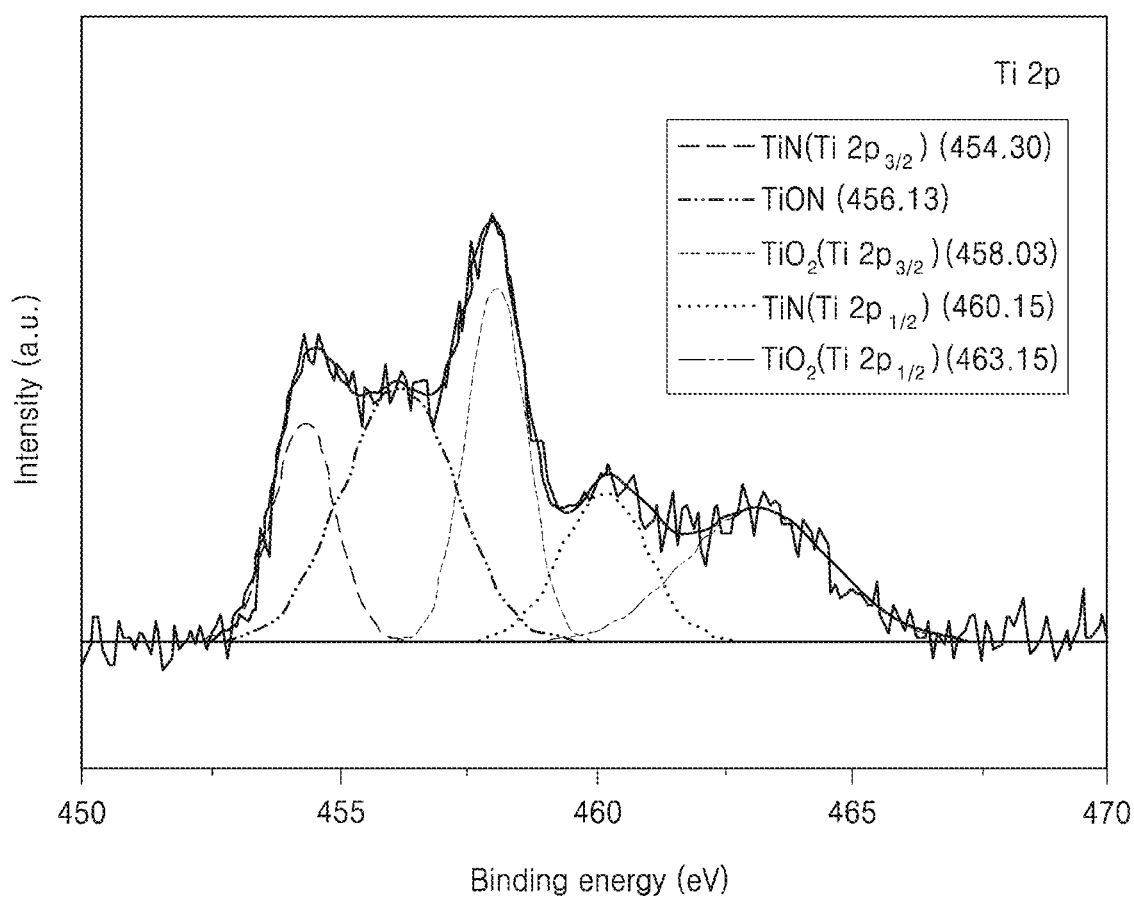
FIG. 12A illustrates XPS spectra for Ti 2p portions of samples of Comparative Example 2.
Figure 12B:
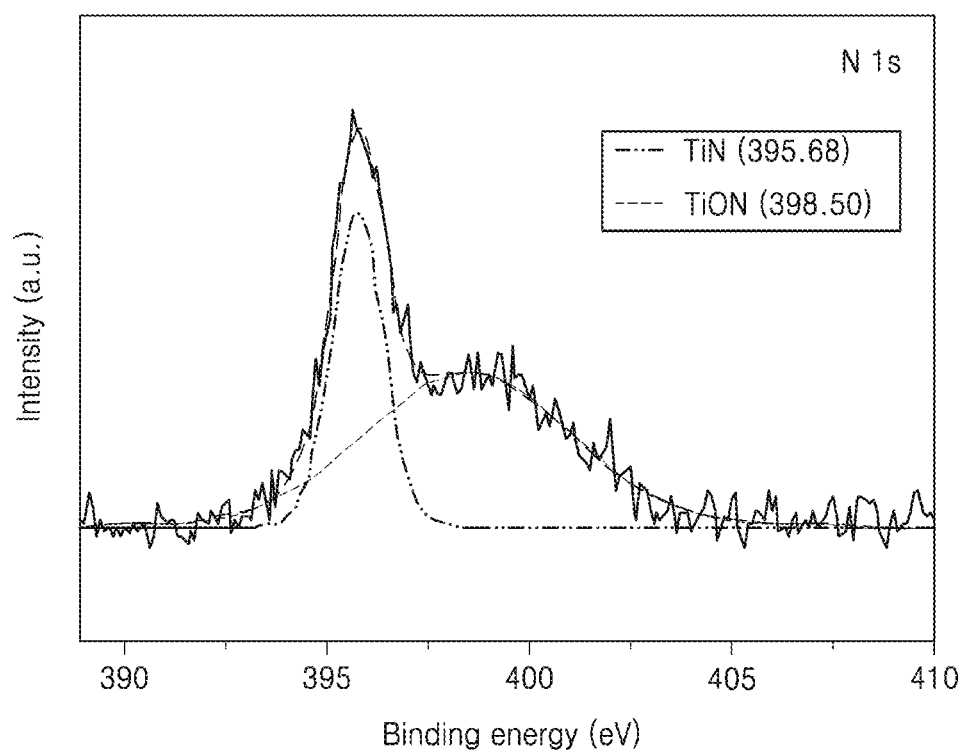
FIG. 12B illustrates XPS spectra for N 1s portions of the samples of Comparative Example 2.

FIGS. 11A and 11B illustrate XPS spectra for Ti 2p and N 1s portions of samples of Test Example 7, respectively. FIGS. 12A and 12B illustrate XPS spectra for Ti 2p and N 1s portions of samples of Comparative Example 2, respectively.

Peaks corresponding to Ti—N, Ti—O—N and Ti—O bonds are observed at the Ti 2p core level XPS spectra shown in FIGS. 11A and 12A, and this suggests that TiN, TiON and $TiO_2$ exist at the interface between TiN and HZO. In the graphs shown in FIGS. 11A and 12A, Ti 2p core level XPS spectra were deconvoluted with five fitting peaks associated with three bonds (Ti—N, Ti—O—N and Ti—O). The binding energies for Ti—N fitting peaks at 454.44 eV of FIG. 11A and 454.30 eV of FIG. 12A correspond to Ti $2P_{3/2}$, and the binding energies for Ti—N fitting peaks at 460.06 eV of FIG. 11A and 460.15 eV of FIG. 12A correspond to

TABLE 2

| | | Remnant polarization | Area ratio | | |
|---|---|---|---|---|---|
| | Interfacial layer | $P_r$ [μC/cm²] | o-phase | t-phase | m-phase |
| Test Example 1 | Lower $HfO_2$ (10 Å) | 22.1 | 0.545 | 0.345 | 0.110 |
| Test Example 6 | Upper $HfO_2$ (10 Å) | 19.63 | 0.506 | 0.380 | 0.114 |
| Comparative Example 1 | — | 17.7 | 0.464 | 0.425 | 0.111 |

Referring to Table 2, in Test Example 1, in which the ferroelectric capacitor includes the $HfO_2$ interfacial layer as a lower $HfO_2$ interfacial layer, the relative (area) ratio of the integrated areas of o-phase peaks is 0.545, which is a highest o-phase area ratio. The o-phase area ratio of 0.506 for the ferroelectric capacitor with the upper $HfO_2$ interfacial layer prepared in Test Example 6, is larger than that of the ferroelectric capacitor prepared in Comparative Example 1, which is 0.464. In general, a ferroelectric HZO film having the highest o-phase ratio demonstrates a highest remnant polarization value. It is considered that the o-phase formation in the HZO film is possibly improved by introducing an upper or lower $HfO_2$ interfacial layer. As can be seen from Table 1, the remnant polarization was significantly reduced when the lower $HfO_2$ interfacial layer has a thickness of 100 Å or greater. From this finding, it is considered that there exists a specific thickness (critical thickness) for the highest remnant polarization value, and the o-phase ratio of the HZO film having a thickness greater than the critical thickness would be reduced.

Meanwhile, the lower and upper electrodes are also considered to serve as key factors in the o-phase formation in the ferroelectric HZO layer. Without wishing to be bound by theory, combined effects of HZO and $HfO_2$ interfacial layer, lower and upper electrodes, lattice mismatch between Ti $2P_{1/2}$. These peaks are induced from the TiN substrate. The peaks corresponding to the Ti—O—N and Ti—O bonds shown in FIGS. 11 Å and 12 Å are provided by titanium oxynitride and titanium dioxide, which may be derived from oxidized TiN. Peaks at 456.12 eV of FIG. 11A and 456.13 eV of FIG. 12A are induced from the Ti—O—N bond. The presence of Ti—O—N suggests that the oxygen in $TiO_2$ is partially substituted by nitrogen.

It is well known that Ti—O—N can cover a wide range of oxygen vacancy, a TiN electrode generally serves as an oxygen storage space, and thus these electrodes may help the creation or recombination of oxygen vacancy. The degree of oxygen vacancy is increased in ferroelectrics due to metal oxynitride formation at the interface between electrodes. The oxygen vacancy is known to facilitate the breakdown mechanism in $HfO_2$, and the breakdown mechanism is clearly shown in a TiN electrode. The oxygen vacancy assists the thin film in early breakdown, leading to enhanced remnant polarization. Therefore, the oxygen vacancy plays an important role in stabilizing the o-phase having an orthorhombic crystal structure in a ferroelectric film.

The ferroelectric capacitor, ferroelectric transistor, and ferroelectric memory device (e.g., collectively ferroelectric devices) according to some example embodiments of the present disclosure may have increased remnant polarization values by forming an interfacial layer between a ferroelectric layer and an electrode and as a result may have improved operational performance and thus may impart improved operational performance to an electronic device including one or more of said ferroelectric devices.

FIG. 14 shows a schematic of a system 1301 configured to control the formation (also referred to herein interchangeably as "fabrication" or "manufacturing") of a ferroelectric device according to some example embodiments. As used herein, a system 1301 may be referred to as a "set."

Referring to FIG. 13A, system 1301 includes a computing device 3010 (also referred to herein interchangeably as an electronic device), a manipulator device 3040, composition (e.g., gas, fluid, etc.) sources 3030-1 to 3030-N (where N is a positive integer), and a process chamber 3020.

Referring first to the computing device 3010, the computing device 3010 may include processing circuitry 3012 (also referred to herein as simply a processor), memory 3014, a power supply 3015, and a communication interface 3016 that are communicatively and/or electrically coupled together via a bus 3011.

The computing device 3010 may be included in one or more various electronic devices, including, for example, a mobile phone, a digital camera, a sensor device, or the like. In some example embodiments, the computing device 3010 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like.

The memory 3014, the processing circuitry 3012, the power supply 3015, and the communication interface 3016 may communicate with one another through the bus 3011.

The communication interface 3016 may communicate data to and/or from an external device using various communication protocols. In some example embodiments, the communication interface may be connected to an electronic line (e.g., wire) and may be configured to receive and process electrical signals from one or more external devices.

The processing circuitry 3012 may execute a program and control one or more aspects of the system 1301, via the communication interface 3016 as shown in FIG. 14. A program code to be executed by the processing circuitry 3012 may be stored in the memory 3014.

The memory 3014 may store information. The memory 3014 may be a volatile or a nonvolatile memory. The memory 3014 may be a non-transitory computer readable storage medium. The memory may store computer-readable instructions that, when executed, cause the execution of one or more methods, functions, processes, etc. as described herein. In some example embodiments, the processing circuitry 3012 may execute one or more of the computer-readable instructions stored at the memory 3014 to cause the system 1301 to perform some of all of the methods described herein, including the method illustrated in FIG. 13A.

In some example embodiments, the communication interface 3016 may include a USB and/or HDMI interface. In some example embodiments, the communication interface 2050 may include a wireless communication interface.

Still referring to FIG. 14, the process chamber 3020 may be any of the process chambers described herein and may include a pedestal and/or chuck 3022 that is configured to structurally support a substrate 3050 upon which a ferroelectric device 4000 (which may be any of the example embodiments of ferroelectric capacitors, ferroelectric transistors, ferroelectric memory devices, or any ferroelectric device according to any of the example embodiments described herein) according to any of the example embodiments may be formed (e.g., "fabricated," "manufactured," etc.). In some example embodiments, the substrate 3050 may be at least a portion of a semiconductor layer that is at least partially included in the ferroelectric device 4000 (e.g., a semiconductor layer 31 of a ferroelectric transistor 30). As shown, the pedestal and/or chuck 3022 may be coupled to a motor such that the electronic device 3010 may be configured to cause the pedestal and/or chuck 3022 to move, via control signals communicated from communication interface 3016, for example to enable the substrate 3050 and/or ferroelectric device 4000 to be moved within, into, and/or out of the process chamber 3020.

Still referring to FIG. 14, system 1301 includes a manipulator device 3040, which may be any device for manipulating thin-film structures and/or substrates into and/or out of a process chamber 3020, and the process chamber 3020 may include a portal 3021 (e.g., door) via which the manipulator device 3040 may access the interior of the process chamber 3020 to provide a substrate 3050 and/or to retrieve at least a ferroelectric device 4000 formed therein. As shown, the manipulator device 3040 and the portal 3021 may be controlled by the electronic device 3010.

Still referring to FIG. 14, the system 1301 includes one or more composition sources 3030-1 to 3030-N(N being a positive integer) which may store various materials, including any materials, dopants, and/or compositions described herein, or any combination thereof, as described herein. The materials may be stored as a gas, as a liquid, as any type of fluid, or any combination thereof. As shown, each separate composition source is coupled to the process chamber 3020 via a separate control device 3032-1 to 3032-N (e.g., control valve), where each control device 3032-1 to 3032-N is configured (e.g., based on being a control valve) to control a supply of a separate material held in a separate (e.g., corresponding) coupled composition source 3030-1 to 3030-N to the process chamber. The composition sources 3030-1 to 3030-N and/or control devices 3032-1 to 3032-N may be controlled by electronic device 3010.

As shown in FIG. 14, the electronic device 3010 may, for example based on processing circuitry 3012 executing a program of instruction stored on memory 3014, communicate with various elements of the system 1301 via communication lines 3018 to cause the system 1301 to form a ferroelectric device 4000 according to any example embodiments herein, for example according to the method for fabricating a ferroelectric capacitor as shown in FIG. 13A, for example according to the method for fabricating a ferroelectric transistor as shown in FIG. 13B, for example according to a method for fabricating a ferroelectric memory device as described above with reference to FIGS. 13A-13B, any combination thereof, or the like. It will be understood that the system 1301 may omit one or more of the elements shown in FIG. 14 (e.g., the pedestal or chuck 3022, or the like).

Figure 15:
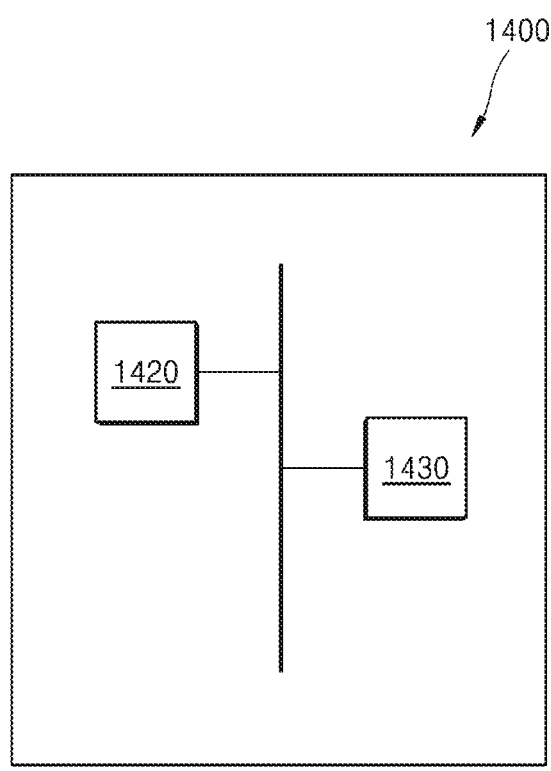
FIG. 15 shows a schematic of an electronic device that may include the ferroelectric capacitor according to some example embodiments.

FIG. 15 shows a schematic of an electronic device that may include a ferroelectric device according to some example embodiments.

As shown, the electronic device 1400 includes one or more electronic device components, including a processor (e.g., processing circuitry) 1420 and a memory 1430 that are communicatively coupled together via a bus 1410.

The processing circuitry 1420, may be included in, may include, and/or may be implemented by one or more instances of processing circuitry such as hardware including logic circuits, a hardware/software combination such as a processor executing software; or a combination thereof. For example, the processing circuitry 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a solid state drive (SSD), storing a program of instructions, and the processing circuitry 1420 may be configured to execute the program of instructions to implement the functionality of the electronic device 1400.

In some example embodiments, the electronic device 1400 may include a ferroelectric device, which may include one or more of the ferroelectric capacitors 10 and/or 20, ferroelectric transistor 30, ferroelectric memory devices 50 and/or 60, any combination thereof, or the like according to any example embodiments of the inventive concepts, in one or more of the processing circuitry 1420 or the memory 1430 and may exhibit improved operational performance as a result, e.g., based on one or more portions of the electronic device 1400 (e.g., the processing circuitry 1420 and/or memory 1430) having improved characteristics.

Figure 16:
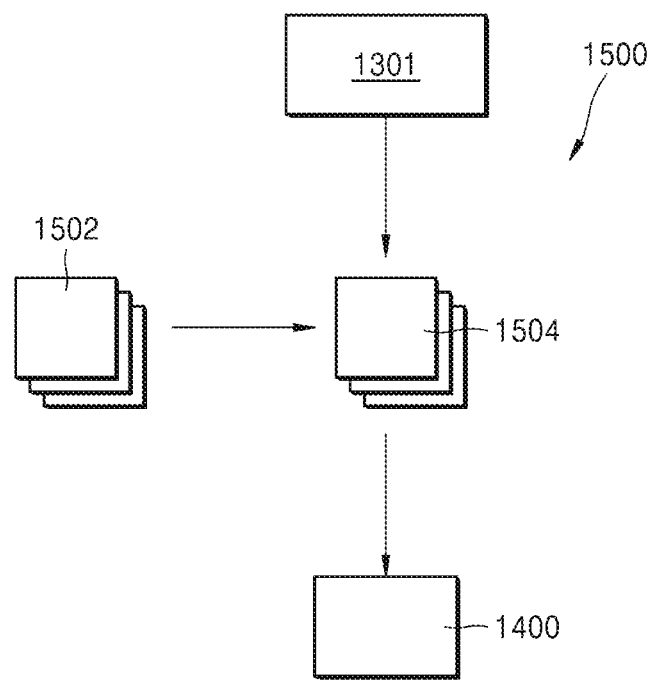
FIG. 16 shows a schematic of a system configured to control the formation of an electronic device according to some example embodiments.
Figure 17:
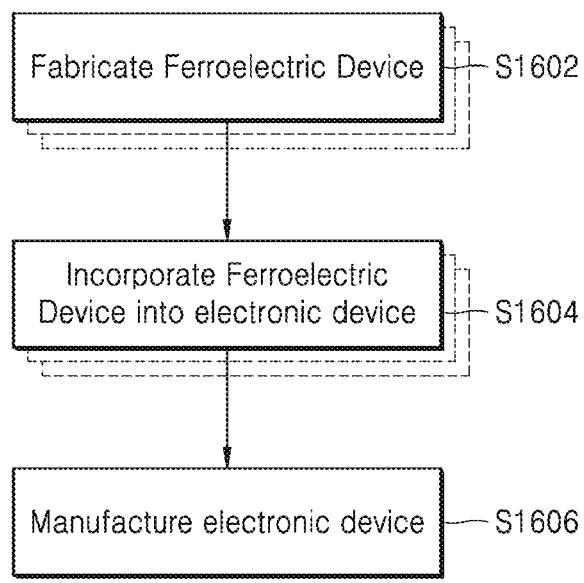
FIG. 17 is a flowchart illustrating a method implemented by the system illustrated in FIG. 16 to manufacture an electronic device according to some example embodiments.

FIG. 16 shows a schematic of a system 1500 configured to control the formation of an electronic device according to some example embodiments, and FIG. 17 is a flowchart illustrating a method implemented by the system 1500 to manufacture an electronic device according to some example embodiments. As shown, the system 1500 may include system 1301, which is configured to form one or more ferroelectric devices 4000 according to any of the example embodiments of the inventive concepts (S1602). The system 1500 further includes a fabrication assembly 1504 that is configured to incorporate the ferroelectric device(s) formed by system 1301 with various electronic device sub-components 1502 (where the electronic device sub-components 1502 may include printed circuit boards, power supplies, buses, communication interface components, processing circuitry components, memory components, any combination thereof, or the like). The fabrication assembly 1504 may incorporate the ferroelectric device(s) 4000 with the sub-components 1502 (S1604), to fabricate ("manufacture") electric device components (e.g., processing circuitries 1420, memories 1430, any combination thereof, or the like) and/or electronic devices themselves, to fabricate ("manufacture") electronic device(s) 1400 that include one or more ferroelectric devices according to any example embodiments of the inventive concepts (S1606). Such incorporation (S1604) and fabrication (S1606) may include, for example, assembling an electronic device component (e.g., processing circuitry 1420 and/or memory 1430 based on incorporating ferroelectric device to additional electronic device sub-components, etc.) based on coupling the ferroelectric device(s) 4000 to one or more electronic device sub-components and coupling the electronic device component to other electronic device components (e.g., printed circuit board, or PCB) to form the electronic device (e.g., 1400).

It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A ferroelectric capacitor for a memory device, the ferroelectric capacitor comprising:
   a first electrode;
   a second electrode facing the first electrode;
   a ferroelectric layer between the first electrode and the second electrode, the ferroelectric layer including a hafnium-based oxide;
   a first interfacial layer directly between the ferroelectric layer and the first electrode such that the first interfacial layer directly contacts both the first electrode and the ferroelectric layer; and
   a second interfacial layer directly between the ferroelectric layer and the second electrode such that the second interfacial layer directly contacts both the second electrode and the ferroelectric layer,
   wherein each of the first interfacial layer and the second interfacial layer is $HfO_2$,
   wherein each of the first interfacial layer and the second interfacial layer has a thickness in a range of more than 40 Å up to 200 Å, and
   wherein the ferroelectric capacitor further includes oxygen vacancies at
      interfaces of the first interfacial layer and at least one of the first electrode or the ferroelectric layer which directly contact the first interfacial layer, and
      interfaces of the second interfacial layer and at least one of the second electrode or the ferroelectric layer which directly contact the second interfacial layer,
   wherein the first interfacial layer, the second interfacial layer, and the ferroelectric layer are separate layers, and the ferroelectric layer includes a different material composition than the first and second interfacial layers.

2. The ferroelectric capacitor according to claim 1, wherein the first electrode and the second electrode each independently include TiN, TaN, RuO2, Ir/IrOx, Ti, TiCN, TiSiN, WSiN, TiAlN, TaAlN, TiAlCN, Ti—W, Ru—TiN, RuCN, Pt, Au, or Al.

3. The ferroelectric capacitor according to claim 1, wherein the first electrode and the second electrode both include TiN.

4. The ferroelectric capacitor according to claim 1, wherein the ferroelectric layer includes hafnium titanium oxide or hafnium silicon oxide.

5. The ferroelectric capacitor according to claim 1, wherein the ferroelectric layer includes hafnium zirconium oxide (HZO).

6. The ferroelectric capacitor according to claim 1 wherein a ferroelectric material of the ferroelectric layer includes an o-phase having an orthorhombic crystal structure.

7. The ferroelectric capacitor according to claim 1, wherein the ferroelectric layer has a thickness in a range of about 50 Å to about 200 Å.

8. The ferroelectric capacitor according to claim 1, wherein the ferroelectric capacitor is configured to
   cause the oxygen vacancies to be generated at the interfaces of the first interfacial layer and the at least one of the first electrode or the ferroelectric layer which directly contact the first interfacial layer while oxygen atoms induced from the first interfacial layer move between each of the first interfacial layer, the first electrode, and the ferroelectric layer, and cause the oxygen vacancies to be generated at the interfaces of the second interfacial layer and the at least one of the second electrode or the ferroelectric layer which directly contact the second interfacial layer while oxygen atoms induced from the second interfacial layer move between each of the second interfacial layer, the second electrode, and the ferroelectric layer.

9. The ferroelectric capacitor according to claim 1, wherein each of the first interfacial layer and the second interfacial layer has a thickness in a range, of 100 Å up to 200 Å.

10. The ferroelectric capacitor according to claim 1, wherein remnant polarization of the ferroelectric capacitor is in a range of about 15 $\mu C/cm^2$ to about 25 $\mu C/cm^2$.

11. A ferroelectric memory device, comprising:
the ferroelectric capacitor according to claim 1; and
a field-effect transistor including
a semiconductor layer including a source region and a drain region,
a dielectric layer on the semiconductor layer, and
a gate electrode on the dielectric layer,
wherein the ferroelectric capacitor is electrically connected to the field-effect transistor.

12. A method of manufacturing a ferroelectric capacitor, the method comprising:
forming a first electrode;
forming a first interfacial layer on the first electrode, the first interfacial layer is $HfO_2$ and has a thickness in a range of more than 40 Å up to 200 Å;
forming a ferroelectric layer on the first interfacial layer such that the first interfacial layer directly contacts both the first electrode and the ferroelectric layer, the ferroelectric layer including a hafnium-based oxide;
forming a second interfacial layer on the ferroelectric layer, the second interfacial layer is $HfO_2$ and has a thickness in a range of more than 40 Å up to 200 Å; and
forming a second electrode on the second interfacial layer such that the second interfacial layer directly contacts both the second electrode and the ferroelectric layer,
wherein the ferroelectric capacitor further includes oxygen vacancies at
interfaces of the first interfacial layer and at least one of the first electrode or the ferroelectric layer which directly contact the first interfacial layer, and
interfaces of the second interfacial layer and at least one of the second electrode or the ferroelectric layer which directly contact the second interfacial layer,
wherein the first interfacial layer, the second interfacial layer, and the ferroelectric layer are separate layers, and the ferroelectric layer includes a different material composition than the first and second interfacial layers.

13. The method according to claim 12, wherein the first electrode and the second electrode both include TiN.

14. The method according to claim 12, wherein the ferroelectric layer includes hafnium zirconium oxide (HZO).

15. A method of manufacturing an electronic device, the method comprising:
forming a ferroelectric capacitor according to the method of claim 12; and
forming the electronic device based on incorporating the ferroelectric capacitor into an electronic device component.

16. The method according to claim 15, wherein the electronic device component includes at least one of a processing circuitry or a memory.

17. A system for forming a ferroelectric device, the system comprising:
a process chamber including a pedestal or chuck configured to structurally support one or more devices or layers in the process chamber;
a plurality of composition sources and a plurality of control devices, each composition source coupled to the process chamber via a separate control device, each control device configured to control a supply of a separate material held in a separate coupled composition source to the process chamber; and
an electronic device configured to control at least the plurality of control devices to fabricate a ferroelectric capacitor based on
forming a first electrode on the pedestal or chuck,
forming a first interfacial layer on the first electrode, the first interfacial layer is $HfO_2$ and has a thickness in a range of more than 40 Å up to 200 Å,
forming a ferroelectric layer on the first interfacial layer such that the first interfacial layer directly contacts both the first electrode and the ferroelectric layer, the ferroelectric layer including a hafnium-based oxide,
forming a second interfacial layer on the ferroelectric layer, the second interfacial layer is $HfO_2$ and has a thickness in a range of more than 40 Å up to 200 Å, and
forming a second electrode on the second interfacial layer such that the second interfacial layer directly contacts both the second electrode and the ferroelectric layer,
wherein the ferroelectric capacitor further includes oxygen vacancies at
interfaces of the first interfacial layer and at least one of the first electrode or the ferroelectric layer which directly contact the first interfacial layer, and
interfaces of the second interfacial layer and at least one of the second electrode or the ferroelectric layer which directly contact the second interfacial layer,
wherein the first interfacial layer, the second interfacial layer, and the ferroelectric layer are separate layers, and the ferroelectric layer includes a different material composition than the first and second interfacial layers.

18. The system according to claim 17, wherein the electronic device is configured to control at least the plurality of control devices to fabricate a ferroelectric memory device that includes the ferroelectric capacitor electrically connected to a transistor, the transistor including a semiconductor layer having a source region and a drain region, a gate dielectric layer on the semiconductor layer, and a gate electrode on the gate dielectric layer, wherein fabrication of the ferroelectric memory device includes connecting a contact to the semiconductor layer and connecting the ferroelectric capacitor to the contact.

19. The system according to claim 17, wherein the first electrode and the second electrode both include TiN.

20. The system according to claim 17, wherein the ferroelectric layer includes hafnium zirconium oxide (HZO).

* * * * *